United States Patent [19]
Takita

[11] Patent Number: 5,990,751
[45] Date of Patent: Nov. 23, 1999

[54] METHOD AND APPARATUS FOR IMPROVING POWER TRANSFER EFFICIENCY OF AN AMPLIFIER SYSTEM

[75] Inventor: Mark K. Takita, Palo Alto, Calif.

[73] Assignee: Nikon Corporation, Tokyo, Japan

[21] Appl. No.: 08/951,774

[22] Filed: Oct. 16, 1997

[51] Int. Cl.⁶ .................................................. H03F 3/38
[52] U.S. Cl. ............................ 330/297; 330/127; 330/10
[58] Field of Search ..................................... 330/297, 127, 330/10; 323/280

[56] References Cited

U.S. PATENT DOCUMENTS

| | | | |
|---|---|---|---|
| 4,115,739 | 9/1978 | Sano et al. | 330/263 |
| 4,206,419 | 6/1980 | Yokoyama | 330/263 |
| 4,430,625 | 2/1984 | Yokoyama | 330/297 |
| 5,075,634 | 12/1991 | French | 330/297 |
| 5,200,711 | 4/1993 | Andersson et al. | 330/297 |

FOREIGN PATENT DOCUMENTS

| | | | |
|---|---|---|---|
| 0023309 | 2/1982 | Japan | 330/297 |
| 0140008 | 8/1982 | Japan | 330/297 |
| 358119209 | 7/1993 | Japan | 330/9 |

*Primary Examiner*—Robert Pascal
*Assistant Examiner*—Khanh Van Nguyen
*Attorney, Agent, or Firm*—Joseph T. Fitzgerald; Michael J. Halbert

[57] ABSTRACT

A linear amplifier provides an output signal that is proportional to an input signal. A differential voltage control unit tracks the output signal voltage and controls the outputs of two pulse width modulators which drive a linear amplifier. The differential voltage control unit controls the output of the positive pulse width modulator to a fixed predetermined value in accordance with at least one of the input or output signals. The positive and negative pulse width modulators are driven by a positive and negative high voltage direct current power supplies respectively.

23 Claims, 16 Drawing Sheets

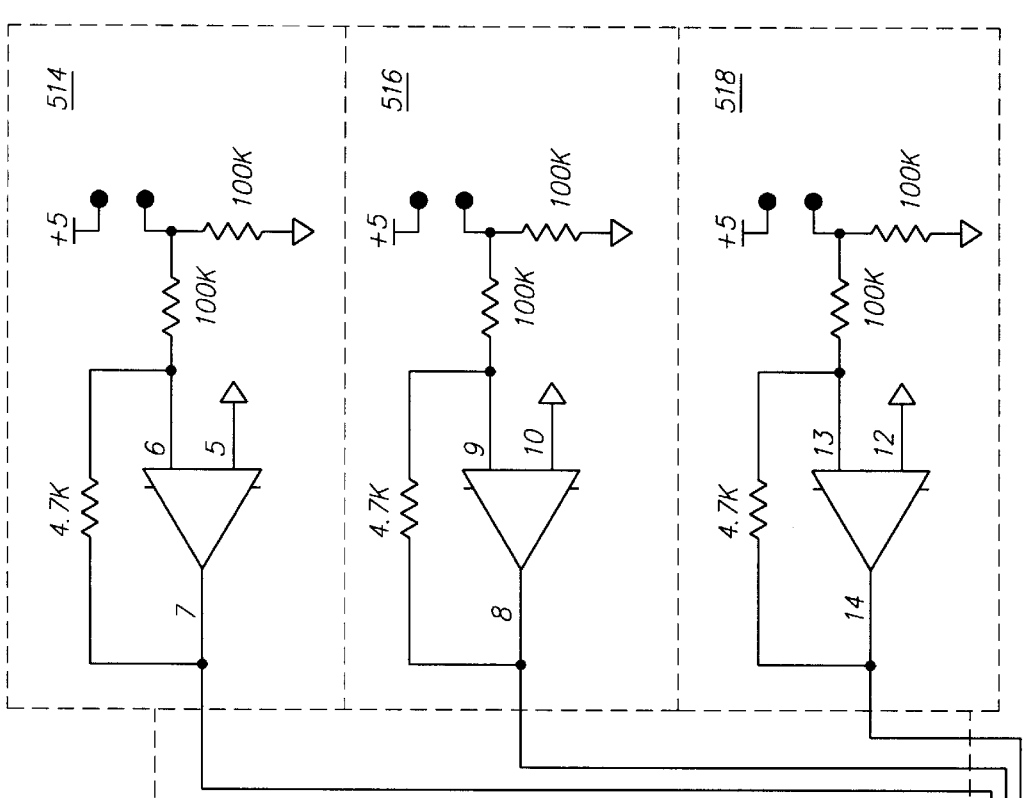
FIG. 5B-3
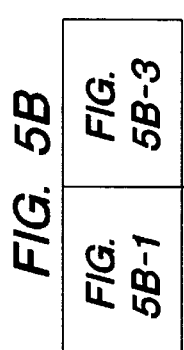
FIG. 5B
| FIG. 5B-1 | FIG. 5B-3 |
| FIG. 5B-2 | |
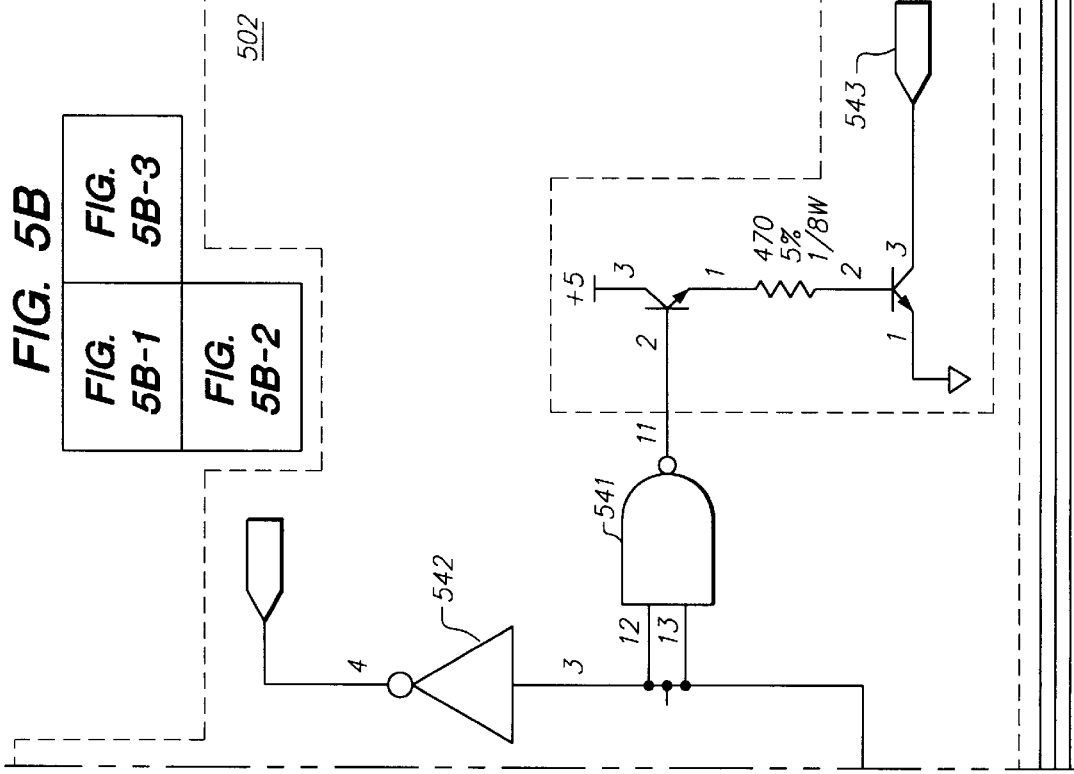

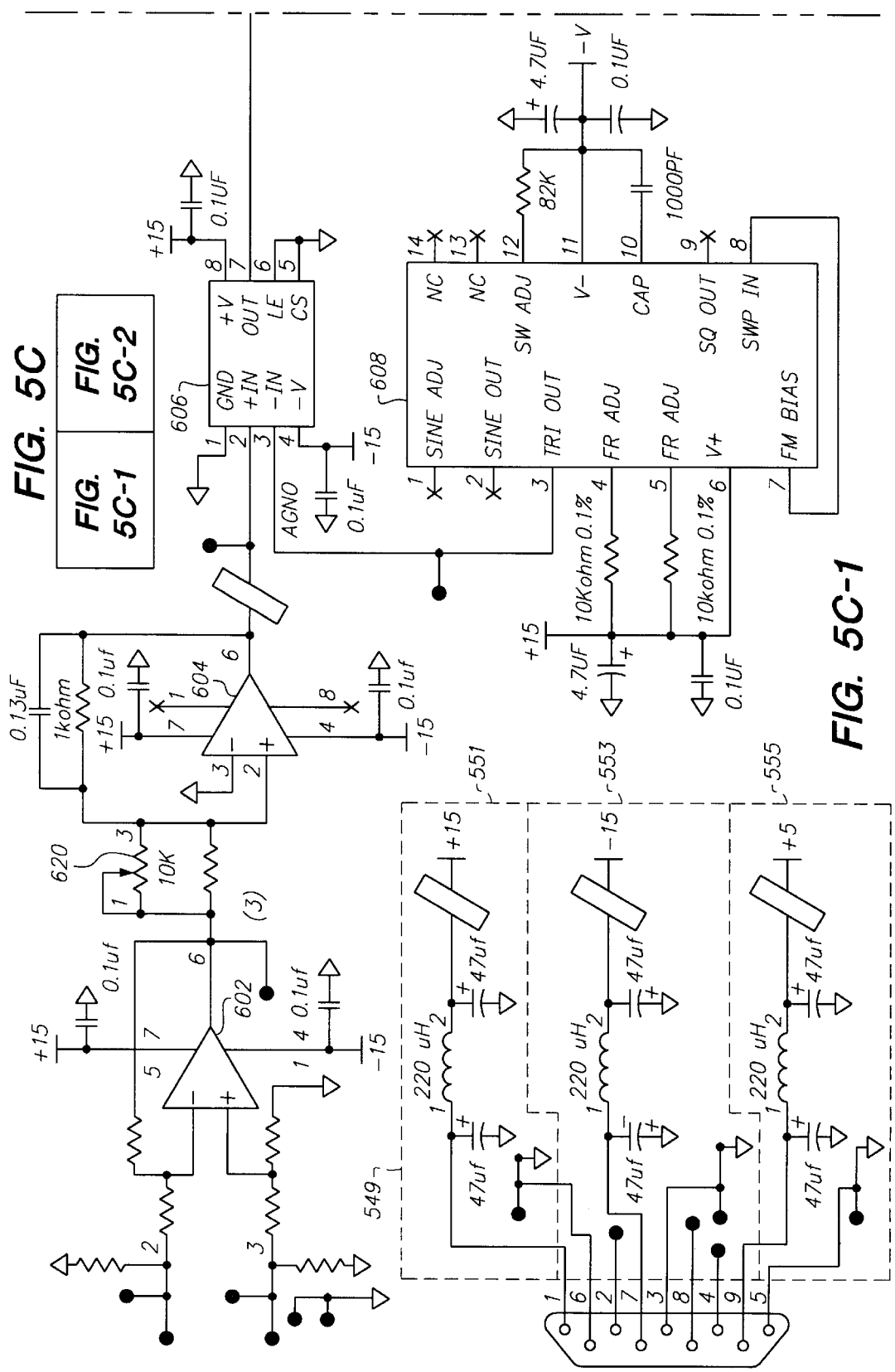

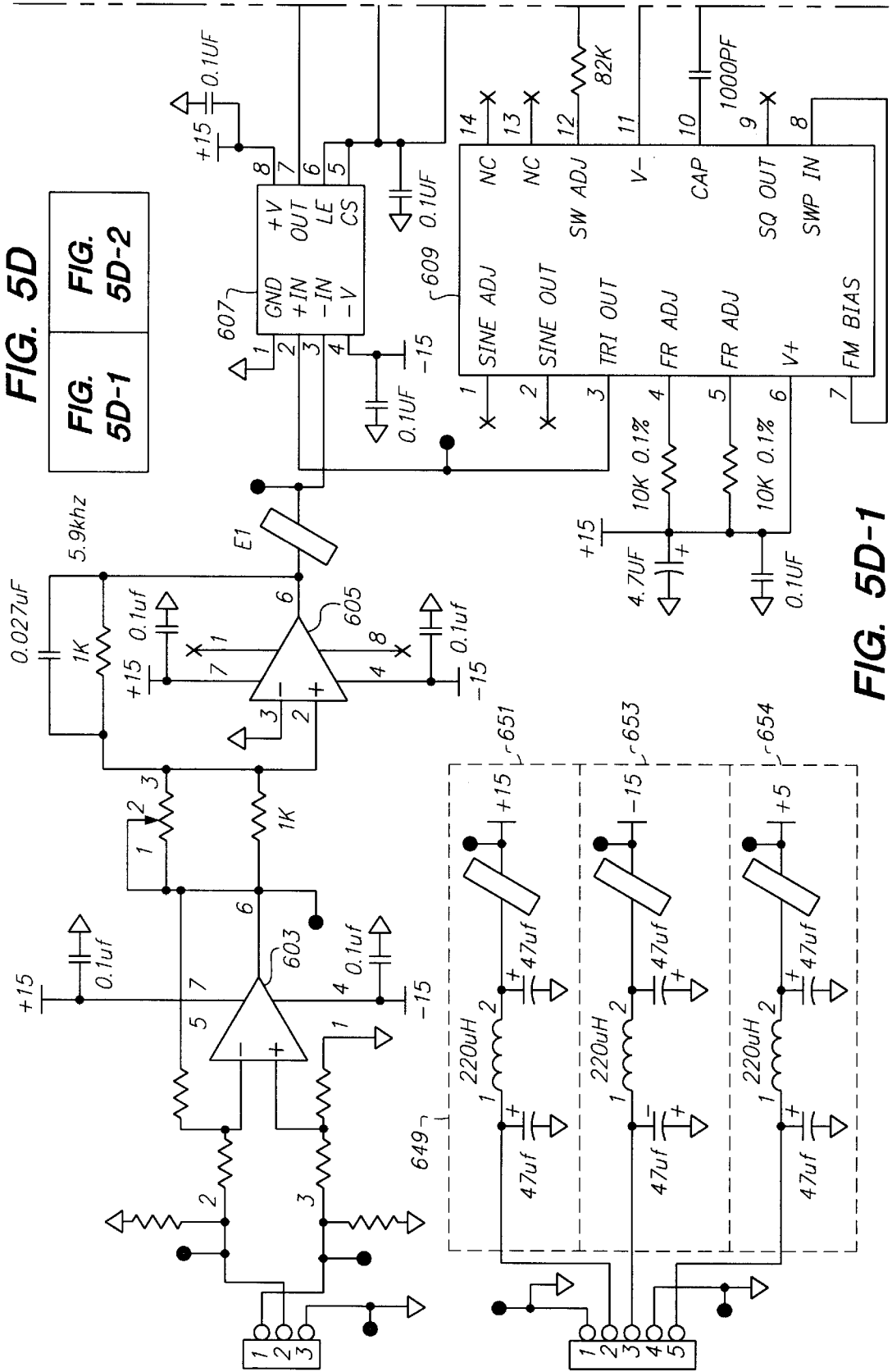

METHOD AND APPARATUS FOR IMPROVING POWER TRANSFER EFFICIENCY OF AN AMPLIFIER SYSTEM

FIELD OF THE INVENTION

The present invention is directed to amplifier systems. More particularly, the present invention is directed to a method and apparatus for improving the power transfer efficiency of amplifier systems, particularly under variable power output operation.

BACKGROUND OF THE INVENTION

Amplifier systems capable of providing variable output power may include linear amplifiers. An amplifier system which uses conventional linear amplification may produce a highly stable low distortion power output. The low distortion output can make linear amplifiers particularly useful in amplifier system applications that require high accuracy such as, for example, very precise linear motors used in semiconductor photolithography stages.

FIG. 1 shows an amplifier system 101 which includes a conventional linear amplifier 103 which supplies an output signal 113, which may be proportional to an input signal 115, to a variable load (not shown). A positive DC power source 105 and a negative DC power source 107 drive the linear amplifier 103. A control system (not shown) may typically be used to make feedforward adjustments to vary the output signal 113. The variable output signal 113 of amplifier system 101 may be used as a power supply to drive a variable load.

The energy efficiency of amplifier system 101 may be inversely proportional to the differential voltage between the output signal 113 and amplifier power sources 105 and 107. When the linear amplifier 103 is operating at a low differential voltage, the amplifier system 101 may be operating efficiently and much of the energy from power sources 105 and 107 may be converted into output signal 113. Conversely, under high differential voltage operation, the amplifier system 101 may operate inefficiently and a substantial portion of the energy from power sources 105 and 107 may be converted into heat rather than output signal 113.

The power sources 105 and 109 typically supply the linear amplifier 103 with fixed voltage power and the amplifier system 101 output voltage may typically vary proportionally to the output signal 113. When the output signal 113 is high powered, the output voltage may also be high. Conversely, when the output signal 113 is low powered the output voltage may be low. Thus, the amplifier system 101 efficiency may vary with the output power. A higher power output signal 113 may result in low differential voltage and improved efficiency. A low power output signal 113 may result in a high differential voltage and decreased efficiency.

Under variable power operation the voltage of output signal 113 may vary significantly. When amplifier system 101 is operating at the maximum output power, maximum efficiency may be utilized. However, under variable power operation, the output signal 113 voltage may typically not be at the maximum level and amplifier system 101 may generally not be operating at maximum efficiency. Although linear amplifier 103 may be suitable for driving high accuracy applications, under variable loads amplifier system 101 with linear amplifier 103 may not be energy efficient.

The aforementioned problems associated with amplifier systems using conventional linear amplification under variable output load conditions may result in severe operational inefficiency and heat generation. In applications that require precise temperature control, heat dissipation can pose a significant design concern. Amplifier systems using conventional linear amplification may require a complicated enclosure to dissipate the excess heat generated when operating at a high differential voltage. Enclosures capable of dissipating the excess heat may require large capacity cooling mechanisms or other environmental controls, adding complexity and costs to the amplifier system.

As those skilled in the art will appreciate, amplifier systems using pulse width modulated ("PWM") amplification can produce a wide range of output power with more energy efficiency than amplifier systems using conventional linear amplification. Because amplifier systems using PWM amplification have higher energy efficiency under variable output power operation, they may be less expensive to operate than amplifier systems using conventional linear amplification. Further, because amplifier systems using PWM amplification may generate little heat energy, less elaborate cooling systems may be required and the amplifier system may be less expensive to build.

FIG. 2 shows a power supply 201 which includes a conventional PWM amplifier 203 which supplies an output signal 213 to a variable load (not shown), which may be proportional to an input signal 215. A positive DC power source 205 and a negative DC power source 207 may be used to drive the PWM amplifier 203. A control system (not shown) may typically be used to make feed forward adjustments to the output signal 213. The variable output signal 213 of PWM amplifier 203 may be used as a power supply to drive a variable load.

Although amplifier systems which use PWM amplification may produce the same power output as amplifier systems which use linear amplification, PWM amplification may lack the performance characteristics required for some applications. More specifically, an amplifier system using conventional PWM amplification may produce output power which includes a high frequency noise. Amplifier systems using PWM amplification may thus not be suitable for photolithography motor drives and other high performance applications which may require noise free power.

Hence, there is a need for an amplifier system which has the PWM amplification characteristic of high operating efficiency across a wide output power range and the linear amplification characteristic of low noise for compatibility with high performance applications.

SUMMARY

The present invention is directed to a high efficiency and high performance amplifier system having increased power transfer efficiency over a wide output power range. In addition, the amplifier system of the present invention may be capable maintaining low noise power output which can be required for high performance applications. Because the amplifier system of the present invention is more efficient than amplifier systems using conventional linear amplification, less energy is consumed and less heat is produced during operation. The present invention may also be smaller in size, more reliable and cost less to produce because fewer cooling mechanisms, such as heat sinks, etc., may be required to prevent the amplifier system from overheating.

An amplifier system in accordance with the present invention may include a linear amplifier, a plurality of pulse width modulators (PWMs), a plurality of DC power sources and a differential voltage controller. Power to the linear amplifier may be provided by a first PWM which is driven by a positive DC power source and a second PWM which is driven by a negative DC power source. The output voltages of the PWMs may be controlled by the differential voltage controller, which may be configured to maintain a specific differential voltage between the linear amplifier power sources and amplifier system output voltage. The output from the amplifier system may be variable single phase AC power having low noise, which is suitable for high performance applications.

In accordance with one embodiment of the present invention, the amplifier system may utilize a feedforward system which may use the input voltage as a control signal for the differential voltage controller which controls the PWM outputs. Because the PWMs may have a greater bandwidth than the linear amplifier, it may be possible to change the output voltage of the PWMs before the linear amplifier requires power supply voltage modification. Because the PWM outputs may quickly respond to changes in the differential voltage controller control signals, the PWM output voltages may always be greater than the linear amplifier output voltage.

In accordance with another embodiment of the present invention, a feedback loop may be used to monitor the output voltage. The output voltage may be forwarded to the differential voltage controller through the feedback loop. By using the amplifier system output voltage as a control signal, the differential voltage controller may adjust the output voltages of the PWMs to an optimum voltage greater than the output voltage. A similar result may also be achieved by forwarding the output voltage directly to the PWMs.

In accordance with yet another embodiment of the present invention, a controller may be used to control the amplifier system input as well as the PWM outputs, allowing the timing of voltage variations to be coordinated. This embodiment may typically be used in applications involving complex amplifier operations. The controller may include an electronic circuit or program run by a computer.

One advantage of the present amplifier system invention may be improved efficiency when used in variable output power conditions. The improved efficiency may be achieved by incorporating PWMs within the inventive amplifier system. The variable PWM output voltages allow the power source voltages to the linear amplifier to be controllable. By controlling the linear amplifier power source voltages, the differential voltage between the linear amplifier power source voltages and the amplifier system output voltage can be maintained at an optimum level. Because the differential voltage may be maintained at an optimum level regardless of the amplifier system output power, the operating efficiency may be drastically improved when used in variable output conditions.

In addition, the linear amplifier performance characteristics, including low distortion and low noise may not be affected by using PWM outputs as the linear amplifier power sources. The embodiments of the present invention greatly attenuate noise created by the PWMs and prevent noise in the PWM outputs from passing to the amplifier system output. Low pass filters can also be placed between the linear amplifier and the PWMs to further remove noise from the linear amplifier power sources. The removal of PWM noise may prevent unnecessary linear amplifier switching and may further improve operating efficiency.

The above and other advantages of the present invention will become more apparent upon a reading of the detailed description of the present invention when considered in conjunction with the drawings, of which the following is a brief description.

DETAILED DESCRIPTION

Figure 1:
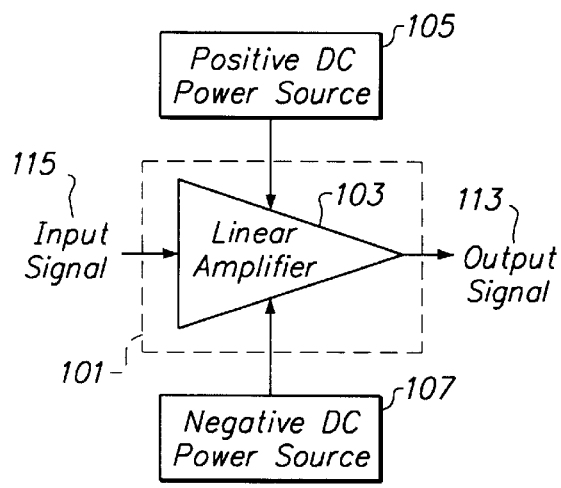
FIG. 1 is a block diagram of an amplifier system using conventional linear amplification.
Figure 2:
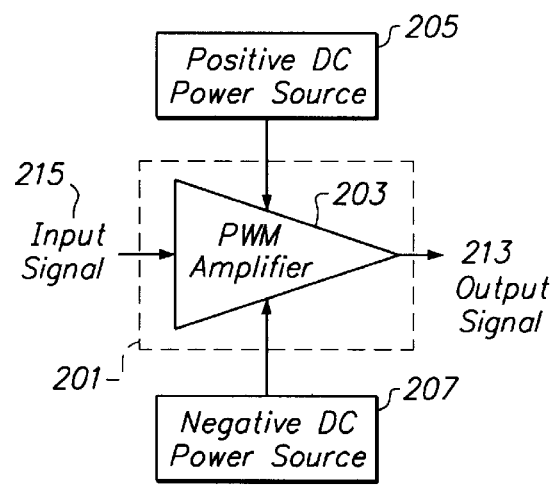
FIG. 2 is a block diagram of an amplifier system using conventional PWM amplification.

The following descriptions are of the presently preferred embodiments of the present invention. It is to be understood that the component values, part numbers, model numbers and manufacturers provided, as well as the particular embodiments illustrated, are merely illustrative of the presently preferred embodiments of the present invention. The present invention is not limited to the described or illustrated embodiments or the particular components shown in the drawings. In the drawings, like reference numbers refer to like elements.

Figure 3C:
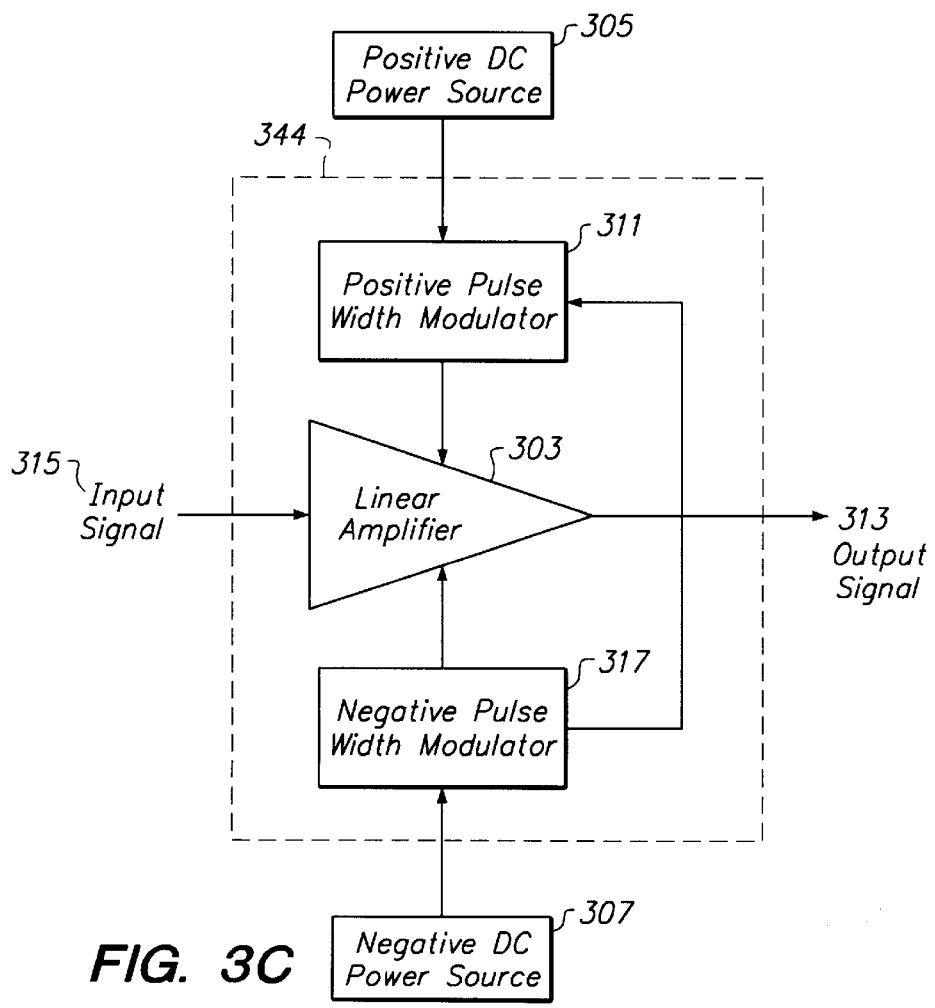
FIG. 3C is a block diagram of an amplifier system in accordance with another feedback embodiment of the present invention.
Figure 3A:
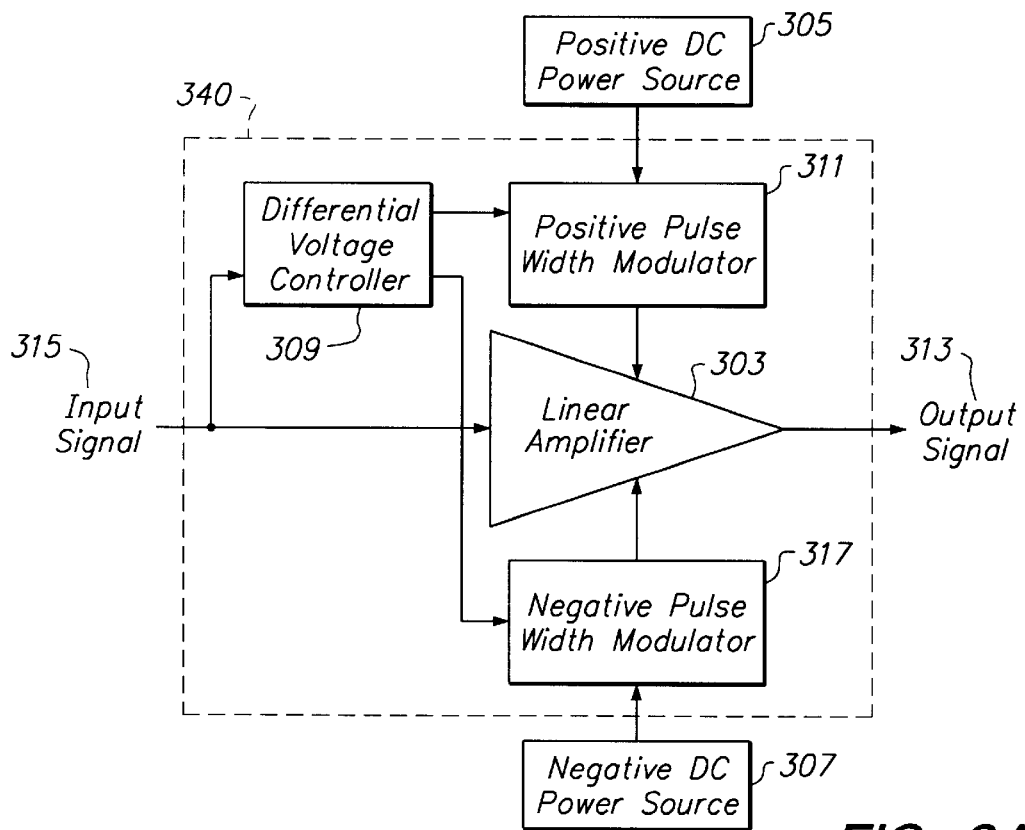
FIG. 3A is a block diagram of an amplifier system in accordance with a feedforward embodiment of the present invention.

FIG. 3A is a block diagram of an amplifier system 340 having a variable output signal 313, in accordance with one embodiment of the present invention. Amplifier system 340 includes a linear amplifier 303, a differential voltage controller 309, a positive pulse width modulator (PWM) 311 and a negative PWM 317. Linear amplifier 303 receives an input signal 315 from a control system (not shown) and provides an output signal 313 to drive a variable demand load (not shown). Differential voltage controller 309 uses the input signal 315 voltage as a feed forward signal to determine the optimum driving voltage for amplifier 303 and may control the outputs of PWMs 311 and 317 to a predetermined optimum voltage greater in magnitude than the voltage of output signal 313. Positive DC power source 305 supplies power to the PWM 311, while negative DC power source 307 supplies power to the PWM 317.

Figure 3B:
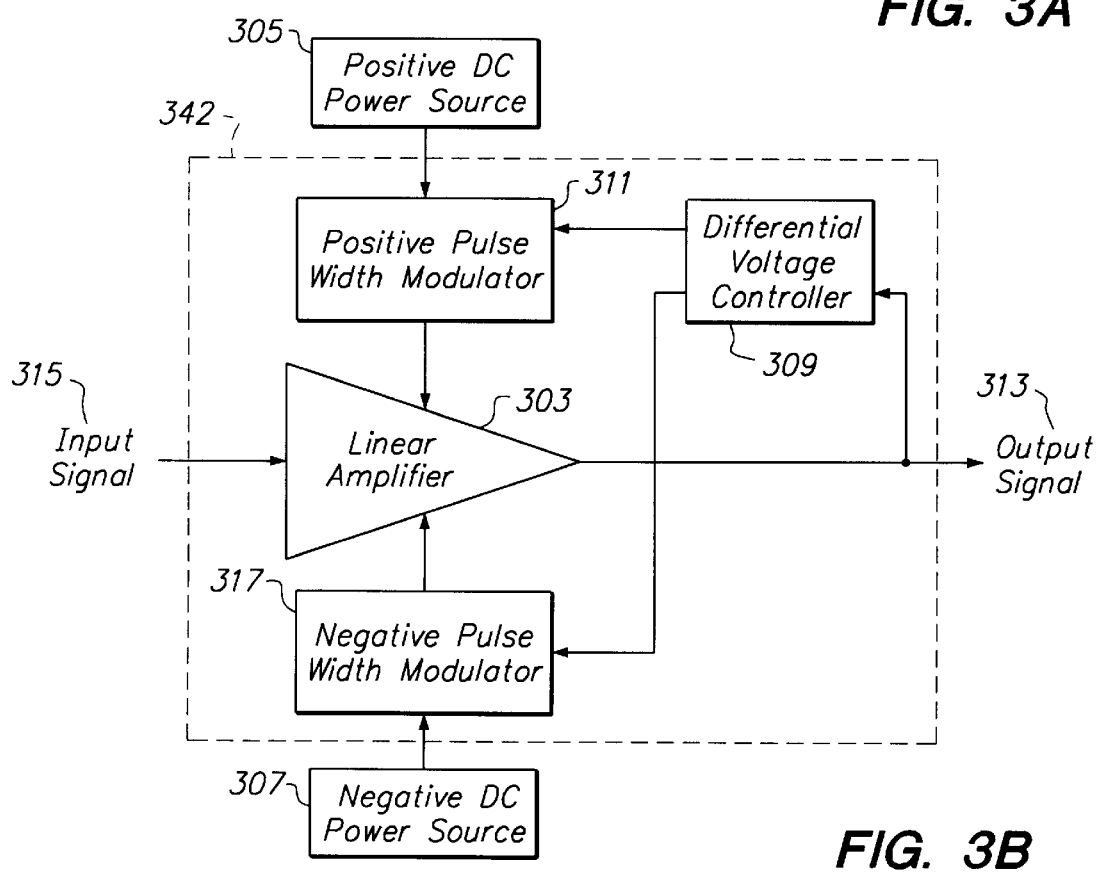
FIG. 3B is a block diagram of an amplifier system in accordance with a feedback embodiment of the present invention.

FIG. 3B is a block diagram of an amplifier system 342 having a variable output signal 313 in accordance with another embodiment of the present invention. Amplifier system 342 includes all of the components discussed in FIG. 3A, however the differential voltage controller 309 uses the output signal 313 as a feedback signal to determine the optimum driving voltage for amplifier 303.

The differential voltage controller 309 used in FIGS. 3A and 3B may include an offset and gain control circuit or a software program run by a computer depending upon the application. Where the amplifier 303 operates in a simple predictable manner, an offset and gain control circuit may be used to monitor the voltages of input signal 315 or the output signal 313 and proportionally control the output voltages of PWMs 311 and 317. Where the amplifier 303 operates in a more complex manner, a software program may be better suited to analyze the trends of the input signal 315 or output signal 313 and forward an appropriate output voltage control signal to PWMs 311 and 317.

The differential voltage controller 309 may typically include a software program run by a computer, where the operation of the amplifier system is complex. Where a software program is used, digital/analog converters may be required between the computer and the rest of the amplifier system. Analog to digital converters allow the computer to sense voltage signals as digital inputs; conversely digital to analog converters allow the computer's digital outputs to be converted into analog voltage control signals. The described converters may be included within the differential voltage controller 309 and allow a digital control system to interact with the rest of the amplifier system.

It is also possible to control the amplifier system without the use of digital/analog converters. As is known in the art, the PWMs 311 and 317 may be configured to receive digital data directly from a computer's digital output in the form of single bit conversion. As discussed above, the computer's digital output may be used to directly control the outputs of PWMs 311 and 317. Because the single bit conversion data is not converted into analog form, the digital/analog converters are not required for amplifier systems in the described configuration.

A typical software program which would be utilized in a differential voltage controller such as 309 would receive input data from the input signal 315 or output signal 313. The program would then analyze the input data and forward a control signal based on the program objectives to PWMs 311 and 317. A software program used to control the differential voltage controller 309 is within the purview of one skilled in the art and may be written in any suitable computer language including Basic, Fortran, Pascal or C. Similarly, the computer used to run the program may be any suitable microprocessor including any of the X86 based or Pentium level microprocessors from Intel or, for example, the K6 microprocessor from Advanced Micro Devices.

The differential voltage controller 309 serves to optimize amplifier 303 efficiency and performance by maintaining a constant differential voltage between the output signal 313 and the outputs of the PWMs 311 and 317. Where the differential voltage is too small the amplifier 303 will not properly function because there will be insufficient differential voltage to drive the amplifier 303. On the other hand, if the differential voltage exceeds the optimum level, the excess input energy will produce undesirable heat and inefficient operation.

When voltage of the output signal 313 varies, the differential voltage controller 309 may optimize performance and efficiency by staggering the output voltage changes of PWMs 311 and 317 relative to the output signal 313 voltage changes. The output voltages of PWMs 311 and 317 should be increased prior to an increase in the output signal 313 voltage. Conversely, a decrease in the output signal 313 voltage should precede the corresponding decrease in output voltages of the PWMs 311 and 317. By staggering the voltage changes as described, the outputs of the PWMs 311 and 317 will always be greater than the output signal 313 voltage by at least the optimum differential voltage.

The optimum differential voltage between the voltage of the output signal 313 and the output voltages of the PWMs 311 and 317 may be dependent upon the amplifier 303 operating characteristics. When the amplifier 303 is a model PA04 from Apex Corporation, the optimum differential voltage has been found to be 8.8 volts. Statistically the differential voltage of 8.8 volts provides a sufficient differential voltage to allow proper operation of 99% of the model PA04 amplifiers, based on the manufacturer's operating specifications. Because operating the amplifier 303 with a differential voltage exceeding 8.8 volts results in inefficient operation and the generation of undesirable heat, the preferred embodiment preferably does not exceed this differential voltage. The differential voltage controller 309 is typically able to maintain the differential voltage at precisely 8.8 volts.

FIG. 3C is a block diagram of an amplifier system 344 having a variable output signal 313 in accordance with yet another embodiment of the present invention. Amplifier system 344 includes all components of FIG. 3B with the exception of the differential voltage controller 309. In FIG. 3C, the output signal 313 is used as a feedback signal for the PWMs 311 and 317 which are configured to supply the linear amplifier 303 with a fixed voltage greater than the voltage of output signal 313.

Because the differential voltage controller 309 is omitted, the voltage supplied to the linear amplifier 303 by PWMs 311 and 317 is not staggered with the output signal 313 voltage nor continuously optimized for efficiency. The response time of the PWMs 311 and 317 is at least as fast as the response time of the linear amplifier 303, thus the PWMs 311 and 317 may quickly react to changes in the output signal 313 voltage. However, because the PWMs 311 and 317 cannot respond instantaneously, the differential voltage can fluctuate when the output signal 313 voltage changes quickly. To prevent the differential amplifier voltage from dropping below the minimum required differential drive voltage, resulting in defective amplifier 303 operation, the controlled differential voltage should be greater than the optimum differential voltage. Since the differential controller 309 is omitted, by driving the linear amplifier 303 with a voltage higher than the optimum differential voltage a "cushion" is provided which may prevent the differential drive voltage of the amplifier 303 from dropping below the minimum functional differential voltage during rapid increases in the voltage of output signal 313.

The differential voltage required to drive the amplifier 303 can be calculated by knowing the slew rate of the amplifier system 344 and the response time lag of the PWMs 311 and 317. The amplifier slew rate is the rate of voltage change for output signal 313 for a given period of time. The response time lag of the PWM is the time required for the PWMs 311 and 317 to respond to a change in control signals from output signal 313. By multiplying the amplifier slew rate by the response time lag of the PWMs 311 and 317, the required time lag differential voltage can be solved. By adding the optimal differential voltage, 8.8 volts in the example above, to the time lag differential voltage, the total differential voltage may be solved.

Figure 3D:
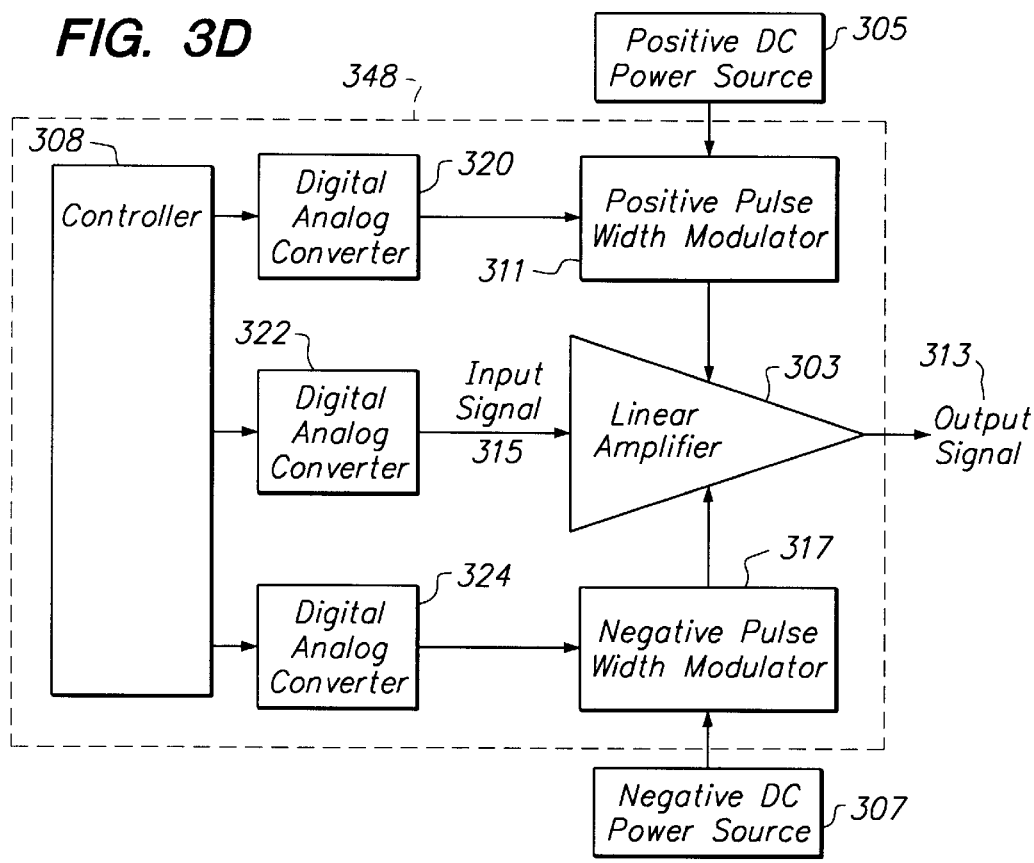
FIG. 3D is a block diagram of an amplifier system in accordance with a controlled embodiment of the present invention.

FIG. 3D is a block diagram of an amplifier system 348 having a variable output signal 313, in accordance with yet another embodiment of the present invention. Amplifier system 348 includes all of the components discussed in FIG. 3A with the exception of differential voltage controller 309 which is replaced with a controller 308. Like the differential voltage controller 309, the controller 308 may comprise a control circuit or, preferably, a software program run by a computer. A typical software program which would be utilized in a controller such as 308 would receive the input signal 315, analyze the output signal 313 data and forward a control signal based on the program objectives to PWMs 311 and 317. Because the controller 308 controls both the input signal 315 and PWMs 311 and 315, the timing of voltage changes may be optimally staggered as discussed. A software program used to control the controller 308 is within the purview of one skilled in the art and may be written in any suitable computer language including Basic, Fortran, Pascal or C. The computer used to run the program may be any suitable microprocessor including any of the X86 based or Pentium level microprocessors from Intel or, for example, the K6 microprocessor from Advanced Micro Devices.

Figure 4A:
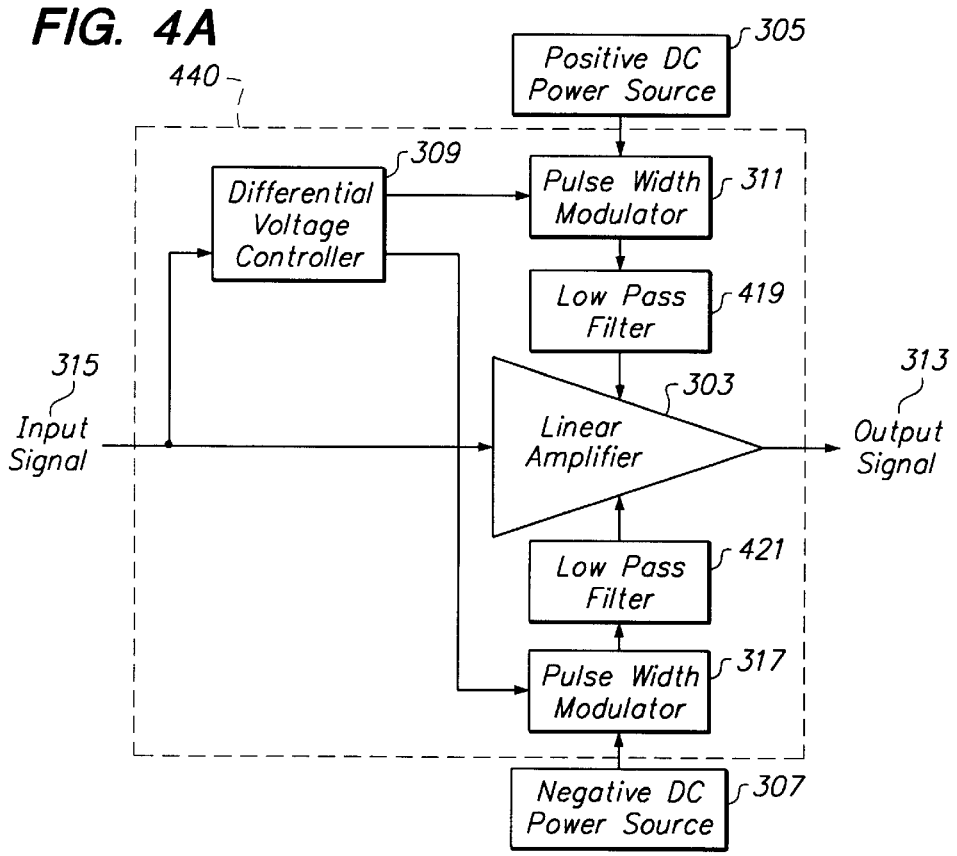
FIG. 4A is a block diagram of an amplifier system in accordance with a feedforward and filtered embodiment of the present invention.

FIG. 4A is a block diagram of an amplifier system 440 in accordance with another embodiment of the present invention. The amplifier system 440 includes the components of FIG. 3A as well as low pass filter circuits 419 and 421. Low pass filter circuit 419 is placed between PWM 311 and linear amplifier 303; low pass filter circuit 421 is placed between PWM 317 and linear amplifier 303. The low pass filter circuits 419 and 421 attenuate a high frequency switching component which exists in the outputs of PWMs 311 and 317, further improving efficiency.

Figure 4B:
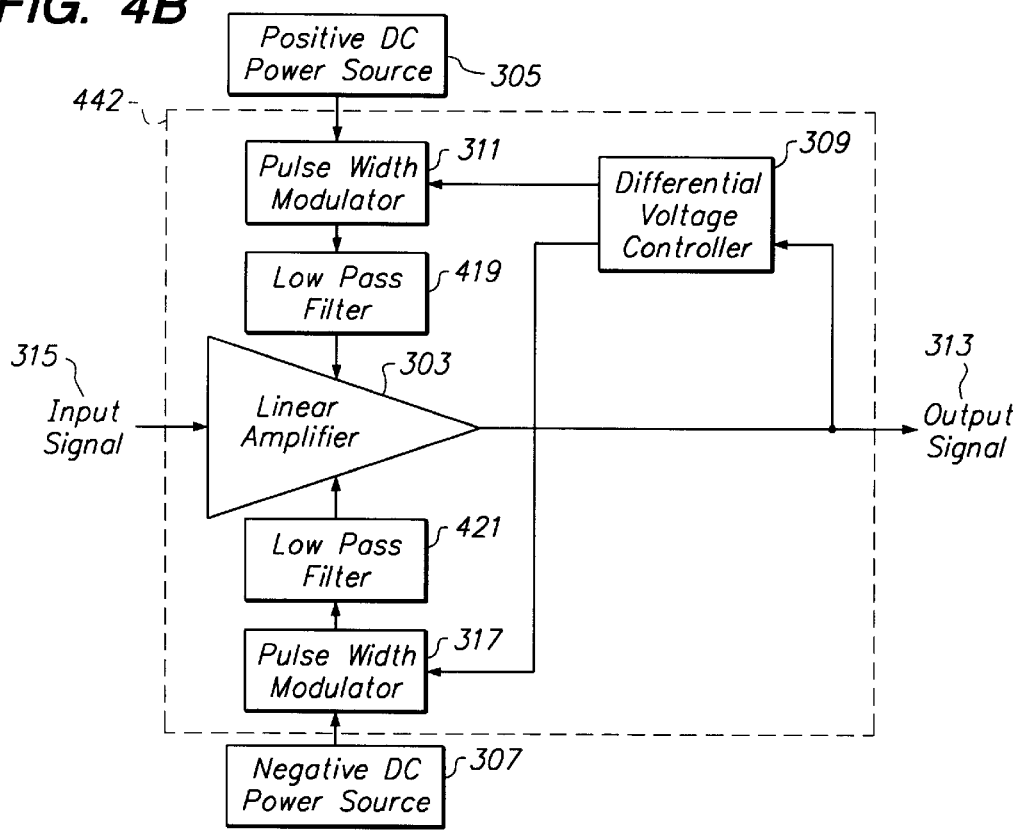
FIG. 4B is a block diagram of an amplifier system in accordance with a feedback and filtered embodiment of the present invention.
Figure 4C:
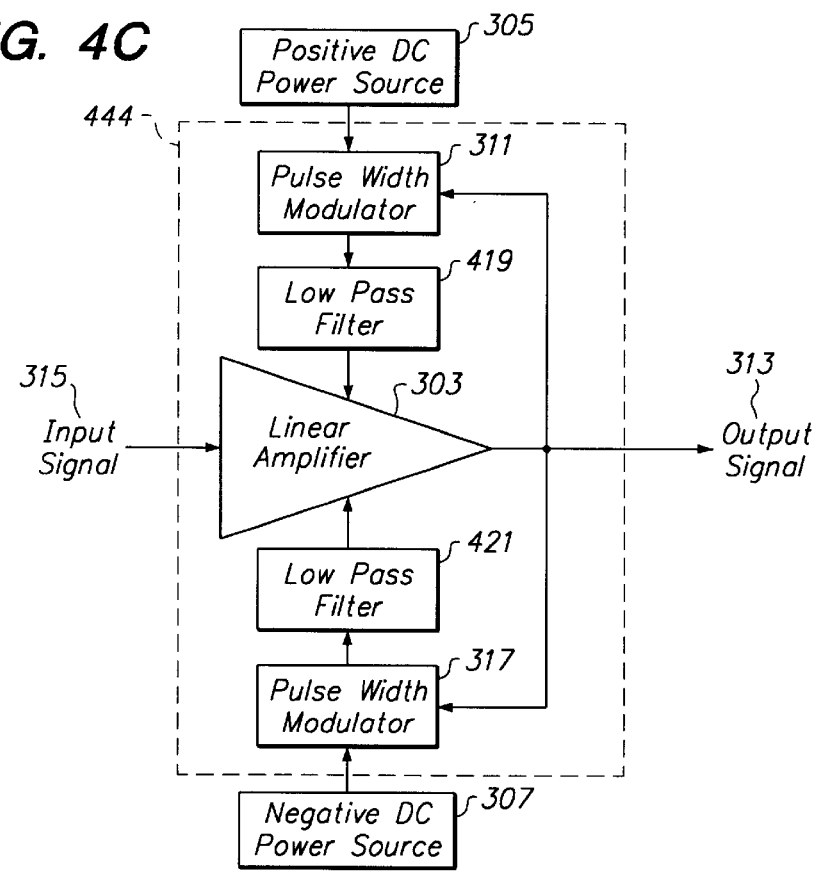
FIG. 4C is a block diagram of an amplifier system in accordance with another feedback and filtered embodiment of the present invention.
Figure 4D:
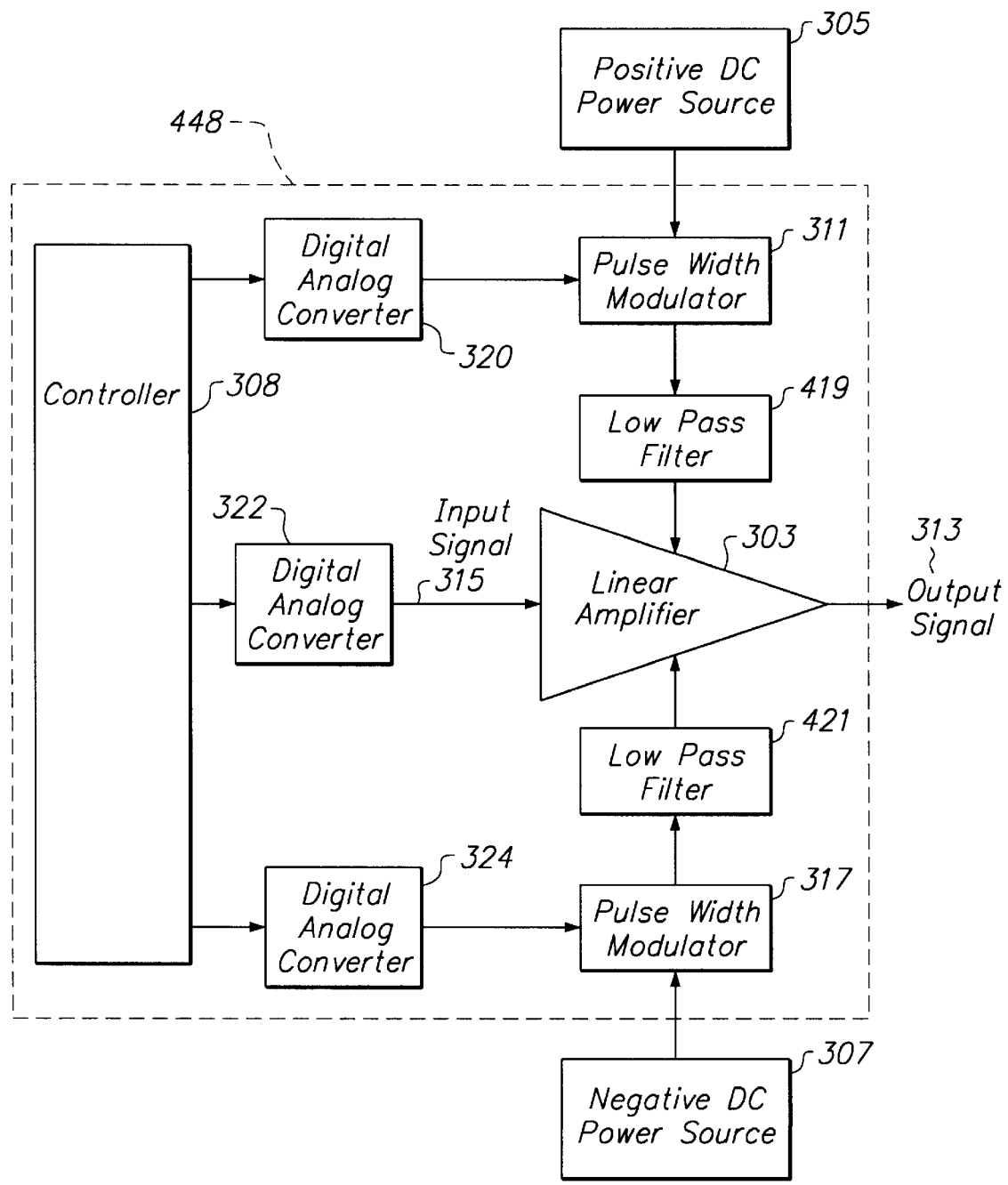
FIG. 4D is a block diagram of an amplifier system in accordance with a controlled and filtered embodiment of the present invention.

Similarly, FIGS. 4B, 4C and 4D are block diagrams of amplifier systems which include the components of FIG. 3B, 3C and 3D respectively as well as low pass filter circuits 419 and 421. As discussed above, the low pass filter circuits 419 and 421 attenuate any high frequency PWM switching components, thereby further improving efficiency.

Figures 1, 5A:
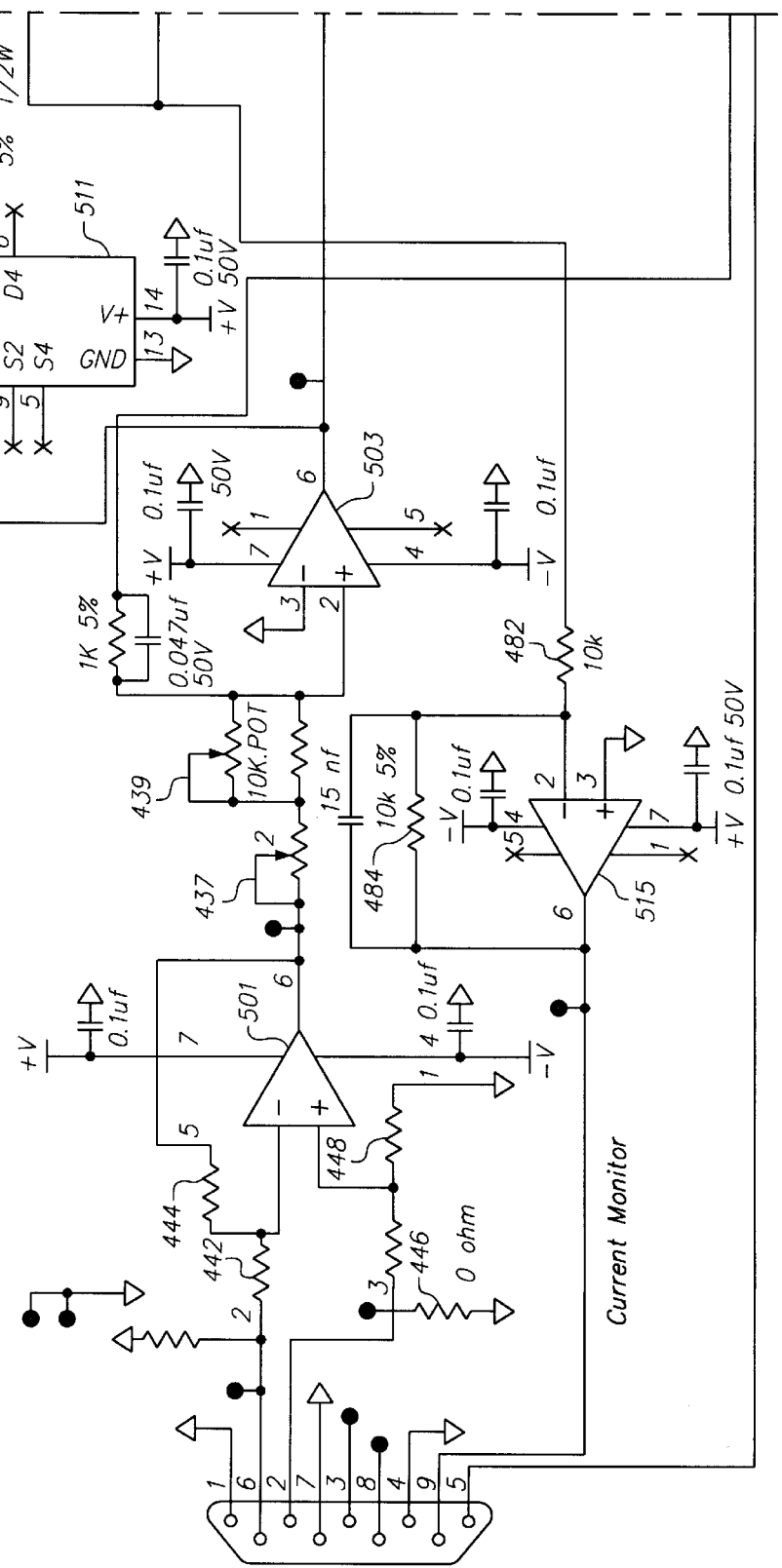
FIGS. 5A and 5B are schematic diagrams of a linear amplifier and monitoring circuit for use with the present invention.
Figures 2, 5A:
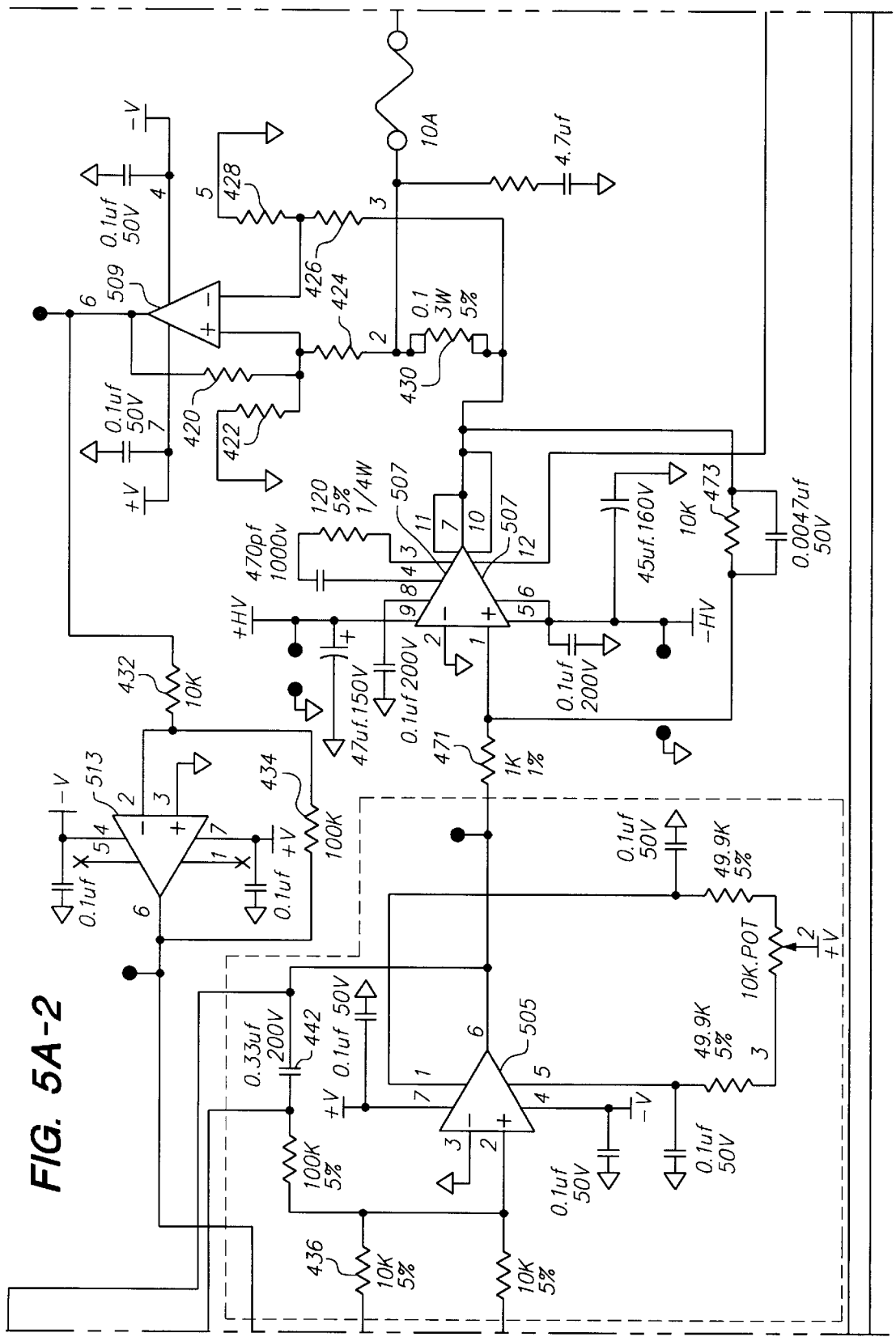
Figures 3, 5A:
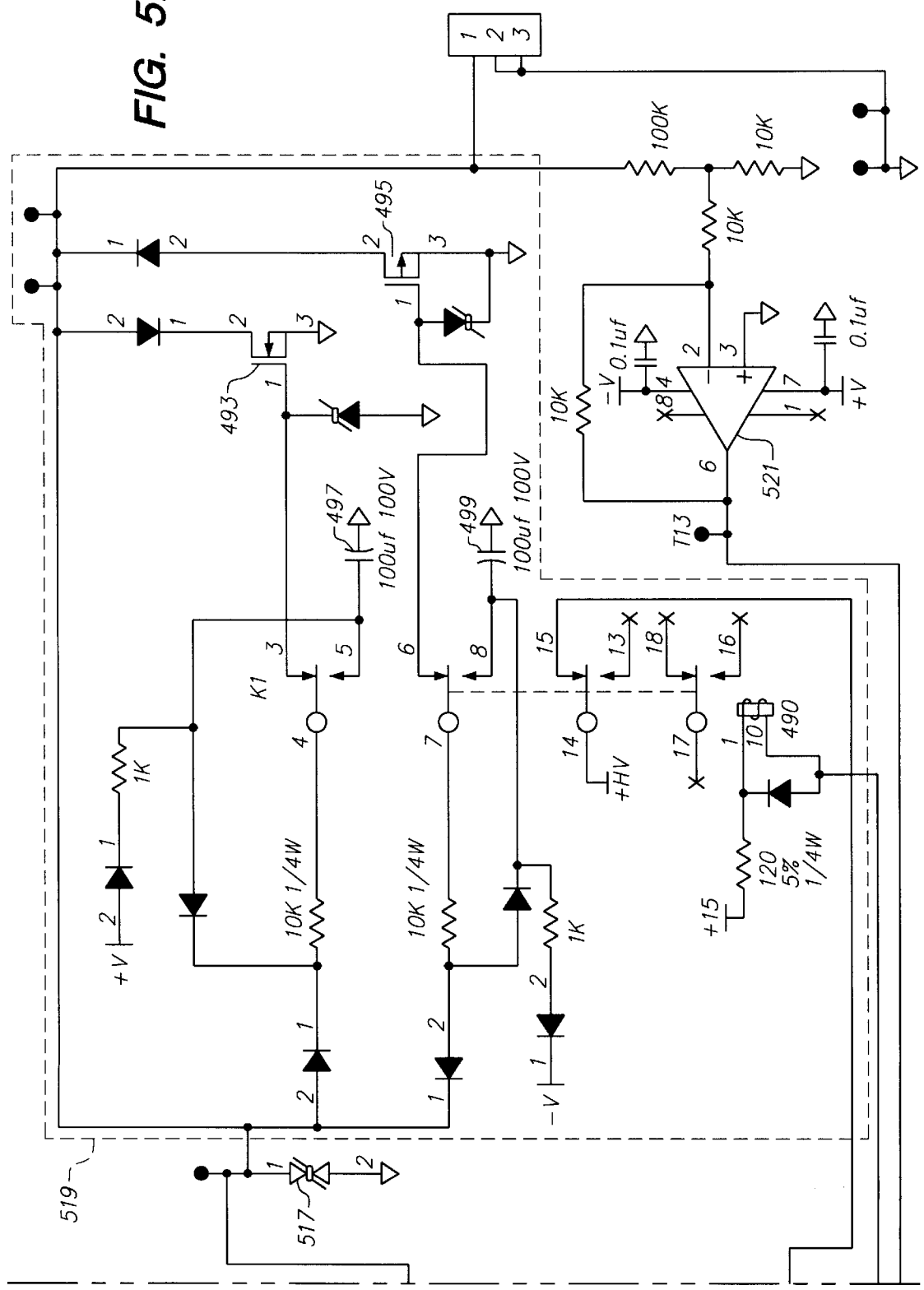

FIG. 5A is a detailed schematic diagram of linear amplifier 303. A preferred embodiment of the linear amplifier 303 includes a high performance buffer circuit 501, a gain control circuit 503, a proportional-integral amplifier circuit 505, a drive amplifier circuit 507, a differential current sensor circuit 509, an analog switch circuit 511, an amplifier circuit 513, a current monitor buffer circuit 515, a transient voltage suppresser 517, a motor brake circuit 519 and an output voltage circuit monitor circuit 521.

Buffer circuit 501 receives an input signal from the control system (not shown), removes common mode noise from the input signal and provides buffering between the control system and the linear amplifier 503. Buffer circuit 501 includes a differential amplifier which may be model INA105 from Burr-Brown and comes in a package that includes feedback resistors 442, 444, 446 and 448. The output of high performance buffer circuit 501 is passed to gain control circuit 503.

Gain control circuit 503 includes an operational amplifier which may be model OPA606 from Burr-Brown. The input signal is amplified by gain control circuit 503 with the amount of amplification being adjusted by the use of a fine gain control potentiometer 437 and a second gross gain control potentiometer 439. By varying the resistance of potentiometers 437 and 439, the input resistor to feedback resistor ratio is changed, effectively altering the amplification of gain control circuit 503. The amplified input signal is then passed to the input of proportional-integral amplifier circuit 505.

Proportional-integral amplifier circuit 505 includes a wide-bandwidth operational amplifier which may be model OPA606 from Burr-Brown. The amplified input signal from gain control circuit 503 and a feedback signal from amplifier circuit 513 (discussed in more detail below) are combined at the input of proportional-integral amplifier circuit 505. The output of proportional-integral amplifier circuit 505 is provided to the input of drive amplifier circuit 507.

Drive amplifier circuit 507 includes a high-power, monolithic operational amplifier, which may be model PA04 from Apex Corporation. Drive amplifier circuit 507 amplifies the proportional-integral amplifier circuit output with a gain of approximately ten due to the ratio of feedback resistor 473 to input resistor 471. The variable voltage outputs of PWMs 311 and 317 pass through filters 419 and 421 prior to providing power to high voltage leads "+HV" and "–HV" of drive amplifier circuit 507 respectively. This is distinguished from the source voltages provided to the other operational amplifiers, which typically have fixed source voltages. The output from drive amplifier circuit 507 passes through a current sense resistor 430 and is supplied to a variable demand load (not shown).

Output voltage monitor circuit 521 monitors the output voltage of drive amplifier circuit 507 and is placed between the drive amplifier circuit 507 output and the control system (not shown). Output voltage monitor circuit 521 includes a precision operational amplifier which may be model OPA177 from Burr-Brown. The output voltage monitor circuit 521 effectively monitors the drive amplifier circuit 507 output signal to detect fault conditions. The output voltage monitor circuit 521 may also use the drive amplifier circuit 507 output signal as a feedback circuit. By sampling the drive amplifier circuit 507 output voltage, corrective adjustments can be made to the voltage outputs of the PWMs 311 and 317.

The transient voltage suppresser 517 is placed between the output of drive amplifier circuit 507 and ground. The transient voltage suppresser 517 may be a model 1.5KE91CA, from General Instruments. If the breakdown voltage of the transient voltage suppresser 517 is exceeded, the excessive voltage from drive amplifier circuit 507 is grounded, protecting the electronic circuitry.

The motor brake circuit 519 may be utilized when the present invention is used to drive an electric motor (not shown) as part of a shut down procedure. The motor brake circuit 519 quickly stops the motor connected to the drive amplifier circuit 507 output when activated by the control system (not shown). The control system may activate the motor brake circuit 519 when any error is detected by the monitoring systems which includes temperature, voltage and operation (discussed below). When a shut off signal is received from the control system a relay 490 is triggered, grounding the electric motor coil. A back electromagnetic force (EMF) is generated by the moving motor coil that is magnetically opposed by the permanent magnets in the motor. This opposing magnetic force serves to brake the motion of the coil and assist in quickly stopping the motor which may have significant inertial energy.

The motor brake circuit 519 is configured to have multi-redundant braking paths for the trigger relay 490 to allow proper shutdown of a motor even in the event of a system or component failure. A coil of motor (not shown) is connected between the drive amplifier circuit 507 output and ground. The positive motion of the motor is arrested by grounding the coil leads by switching a transistor 493. The negative motion of the motor is arrested by switching a transistor 495.

Normally capacitors 497 and 499, which are charged during normal operation provide the power required to switch transistors 493 and 495 respectively when trigger relay 490 is activated. The capacitors 497 and 499 are charged primarily by the drive amplifier circuit 507 output, the positive output voltage charges the capacitor 497 while the negative output voltage charges the capacitor 499. If there is a failure of the drive amplifier circuit 507, the capacitors 497 and 499 are charged by the +15 volt supply and the −15 volt supply respectively. The capacitors may also be charged by the back EMF voltage generated by the movement of the motor coil through the magnetic field of the permanent magnets.

Differential current sensor circuit 509 monitors the output current of drive amplifier circuit 507 by sensing the voltage across resistor 430. Sensor circuit 509 includes a difference amplifier which may be model INA117 from Burr-Brown and comes in a package that includes feedback resistors 420, 422, 424, 426 and 428. The sensor circuit 509 provides a signal proportional to the output current of drive amplifier circuit 507. The output of differential current sensor circuit 509 is passed to the amplifier circuit 513.

Amplifier circuit 513 includes a wide-bandwidth operational amplifier which may be model OPA606 from Burr-Brown. The gain of current amplifier circuit 513 is approximately ten due to the ratio of feedback resistor 434 to input resistor 432. The output of current amplifier circuit 513 is passed as a feedback signal to the input of proportional-integral amplifier circuit 505 through resistor 436 (discussed above), and as an output current monitor signal to current monitor buffer circuit 515.

Current monitor buffer circuit 515 includes a wide-bandwidth operational amplifier which may be model OPA606 from Burr-Brown. The current monitor buffer circuit 515 has an amplification of approximately one due to the ratio of feedback resistor 484 to input resistor 482. The current monitor buffer circuit 515 serves the purpose of providing buffering between the amplifier and the control system (not shown). The output of current monitor buffer circuit 515 passes to the control system.

The control system uses the current monitor buffer circuit 515 output signal to automatically calibrate the control system, monitor the efficiency of the amplifier, monitor the output for faults, monitor the circuit operation and monitor the load condition. Output faults can be detected where there is an inconsistent output current and voltage for a given set of operating conditions. When an inconsistent set of operating conditions is detected, the amplifier system is shutdown for maintenance.

Control system calibration is achieved by monitoring system gain and appropriately changing the input voltage to compensate for any changes. The efficiency of the amplifier is monitored by measuring the differential voltage between the PWM outputs and the linear amplifier output. The lost energy may be represented by multiplying the output current by the differential voltage between the PWMs and the linear amplifier output.

Analog switch circuit 511 is coupled across capacitor 442 and zeroes the voltage across capacitor 442 when linear amplifier 303 is off or in a standby mode. Analog switch circuit 511 keeps capacitor 442 from charging due to leakage current and thus guarantees zero output current $I_0$ for zero input voltage on the input terminal when power is applied to proportional-integral amplifier circuit 505. The control system (not shown) activates analog switch circuit 511 when linear amplifier 303 is off or in a standby mode by providing a logic one (e.g., five volts) to an input terminal "TRIG". Analog switch circuit 511 includes a high-level CMOS analog switch which may be model IH5043 from Harris Semiconductor Corporation.

Figures 1, 5B:
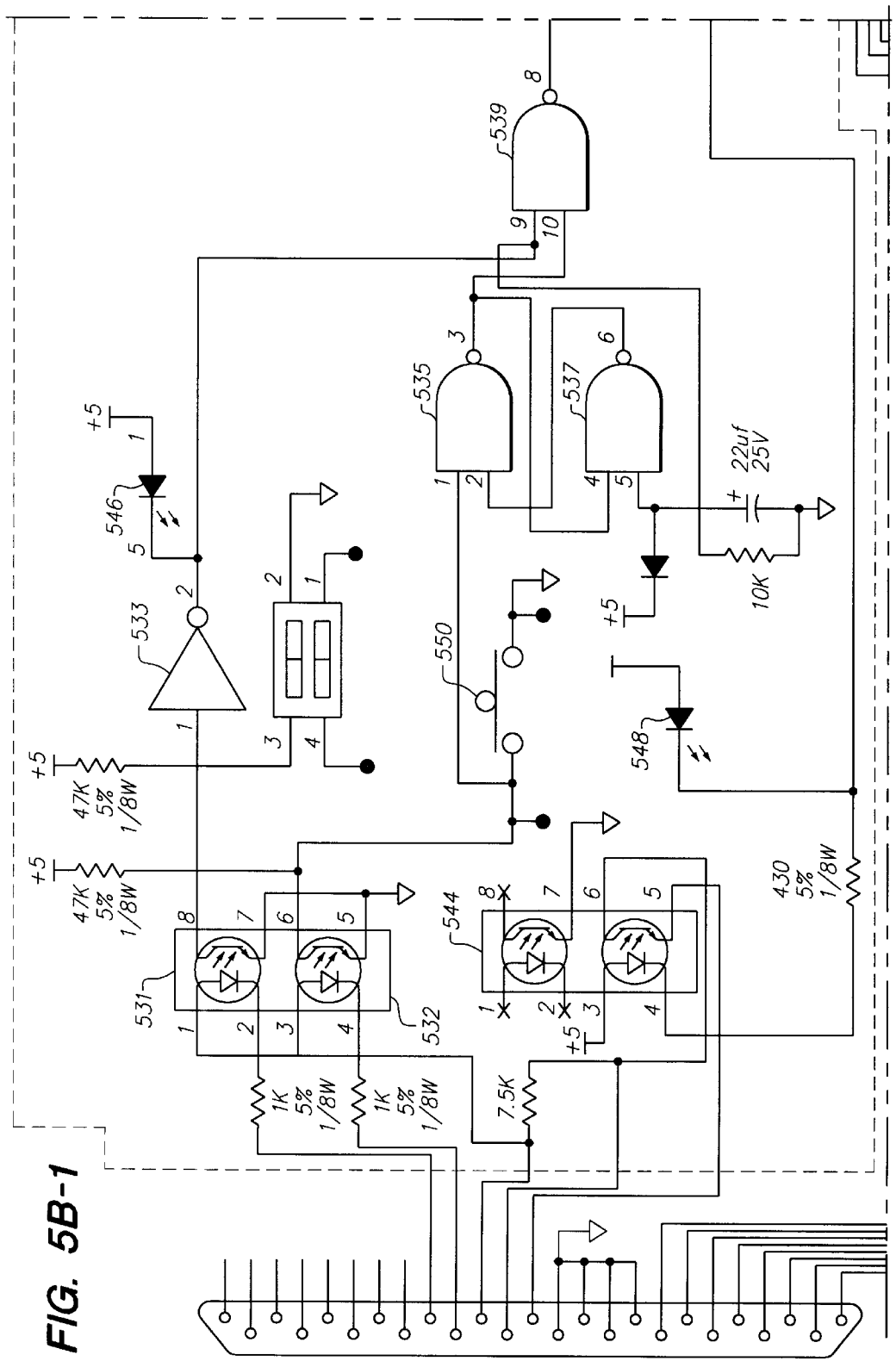
Figures 2, 5B:
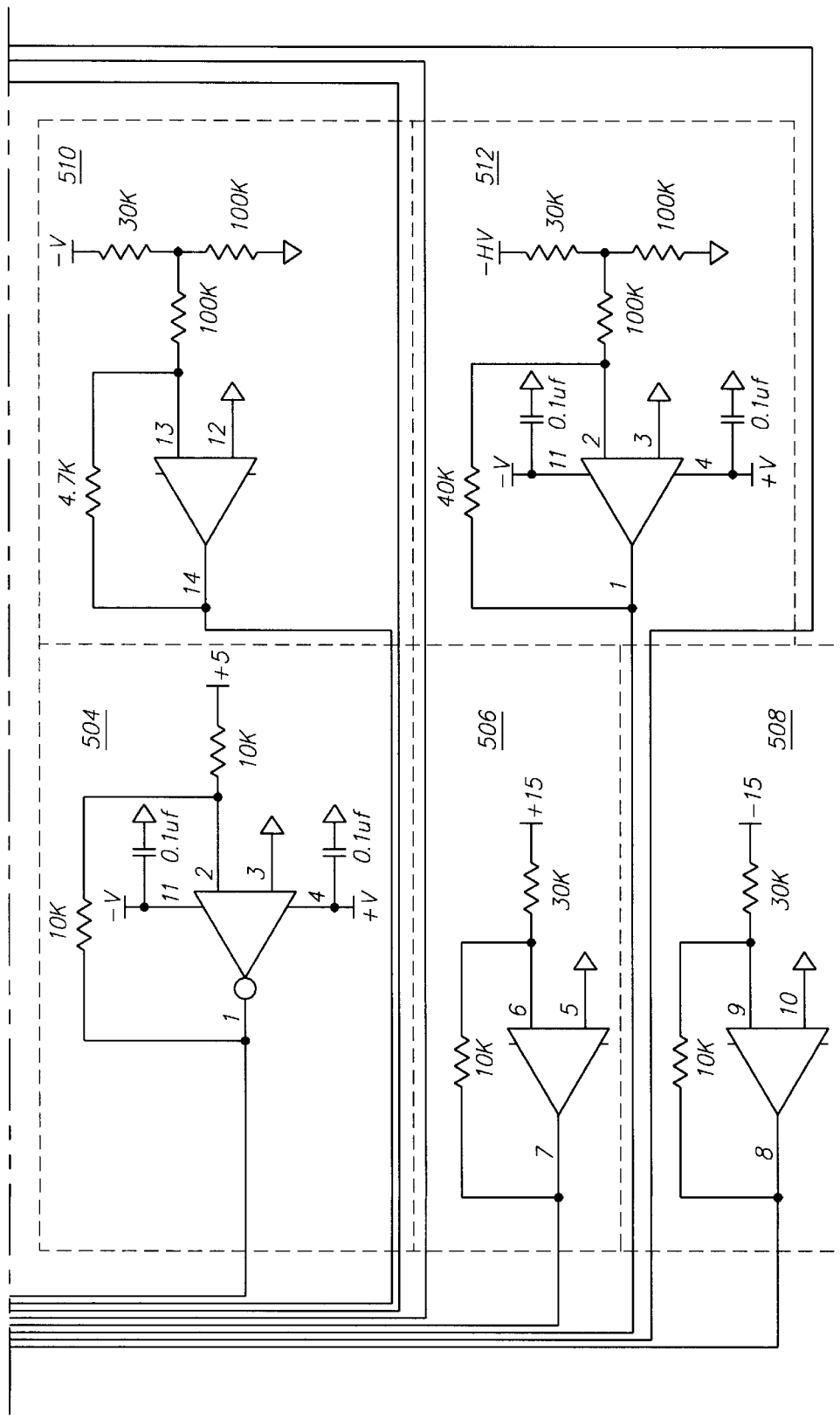

FIG. 5B is a detailed schematic diagram of the monitoring and control circuits that works with linear amplifier 303. The monitoring and control circuits includes a digital shutdown control circuit 502, voltage monitor circuits 504, 506, 508, 510 and 512, and temperature monitor circuits 514, 516 and 518. The voltage and temperature monitor circuits are connected to a control system which may activate the digital shutdown control circuit 502 and the motor break circuit 519 when an error condition is detected.

The digital shutdown control circuit 502 includes opto-isolators 531, 532 and 544, inverters 533 and 542, NAND gates 535, 537, 539 and 541, LEDs 548 and 546, a reset switch 550 and a relay driver circuit 543. The digital shutdown control circuit 502 disables the linear amplifier 303 during shutdown and monitors the linear amplifier 303 during normal operation. When a disable signal is sent from the control system (not shown) to opto-isolators 531, the motor brake circuit 419 on FIG. 4A and the analog switch circuit 411 on FIG. 4A are activated.

Opto-isolators 531, 532 and 544 function to electrically isolate the rest of the digital shutdown control circuit 502 from the control system (not shown). Opto-isolators 531, 532 and 544 are optocouplers which may be model TIL192A from Texas Instruments. During normal operation, voltage signals are passed to opto-isolators 531, 532 and 544, shorting their respective output leads.

During normal operation a logic zero (e.g., zero volt) signal is sent to the inverter 533 input resulting in a logic one (e.g., five volt) output. The logic one signal proceeds to the output of LED 546, lead 9 of NAND gate 539 and lead 5 of NAND gate 537. LED 546 is normally not illuminated because both input and output leads are logic one. NAND gates 535, 537, 539 and 541 may be model SN74S00 from Texas Instruments.

NAND gates 535 and 537 are configured as a flip-flop circuit. During normal operation, after reset switch 550 has been activated or a reset signal has been sent to opto-isolator 532, a logic one will exist at input lead 10 of NAND gate 539. When both input leads of NAND gate 539 are logic one, the output is logic zero. The logic zero output of NAND gate 539 is connected to the inputs of inverter 542, NAND gate 541 and opto-isolator 544. The logic zero input to inverter 542 results in a logic one output and the analog switch circuit 411 is not engaged. The logic zero input to NAND gate 541 results in a logic one output which is passed to relay driver circuit 543 which is configured so that relay 490 and motor break circuit 419 on FIG. 4A are not activated. The logic zero signal also causes LED 548 to illuminate and causes opto-isolator 544 to forward a normal operation signal to the control system (not shown).

When a logic zero error signal from the control system (not shown) is sent to opto-isolator 531, the output of NAND gate 539 is logic one, the output of inverter 542 is logic zero and analog switch circuit 511 on FIG. 5A is triggered (discussed above). Similarly, the output of NAND gate 541 becomes logic zero, which triggers relay driver circuit 543 and relay 490 on FIG. 5A and activates motor brake circuit 419 on FIG. 5A. A logic one signal is sent to the output of LED 548 turning it off and to opto-isolator 544, resulting in an error status signal being sent to the control system. The flip-flop circuit stores the error signal and the digital shutdown control circuit 502 remains under error status regardless of a subsequent normal operation logic one signal passed through opto-isolator 531. The normal operating condition of the digital shutdown control circuit 502 is reestablished only after a normal operation logic one signal is received by opto-isolator 531 and a reset logic one signal is received by lead 10 of NAND gate 539 or a normal operation logic one signal is received by opto-isolator 531 and opto-isolator 532 is pulsed logic zero or reset switch 550 is activated.

Monitor circuits 504, 506, 508, 510, and 512 allow the control system (not shown) to detect abnormal voltage (fault) conditions in the DC voltage supplies and forward a proportional signal to the control system. Monitor circuits 504, 506, 508, 510, and 512 include a low power operational amplifier which may be model LM2902 from National Semiconductor. If an error is detected, the control system may shutdown the amplifier system. Table 1 lists the monitor circuits and the corresponding monitored voltage.

TABLE 1

| Monitor circuit number | Voltage monitored |
| --- | --- |
| Monitor circuit 504 | +5 volt |
| Monitor circuit 506 | +15 volt |
| Monitor circuit 508 | −15 volt |
| Monitor circuit 510 | +HV volt |
| Monitor circuit 512 | −HV volt |

Temperature monitor circuits 514, 516 and 518 are amplifier circuits which are connected to thermistors or other temperature sensors (not shown) placed on output stage devices (not shown) to monitor operating temperature. If excess temperature is sensed the digital shutdown control circuit 502 is triggered. Signals proportional to the thermistor outputs are forwarded to the control system (not shown). The monitor circuits 514, 516, and 518 include a low power operational amplifier which may be model LM2902 from National Semiconductor.

Figures 2, 5C:
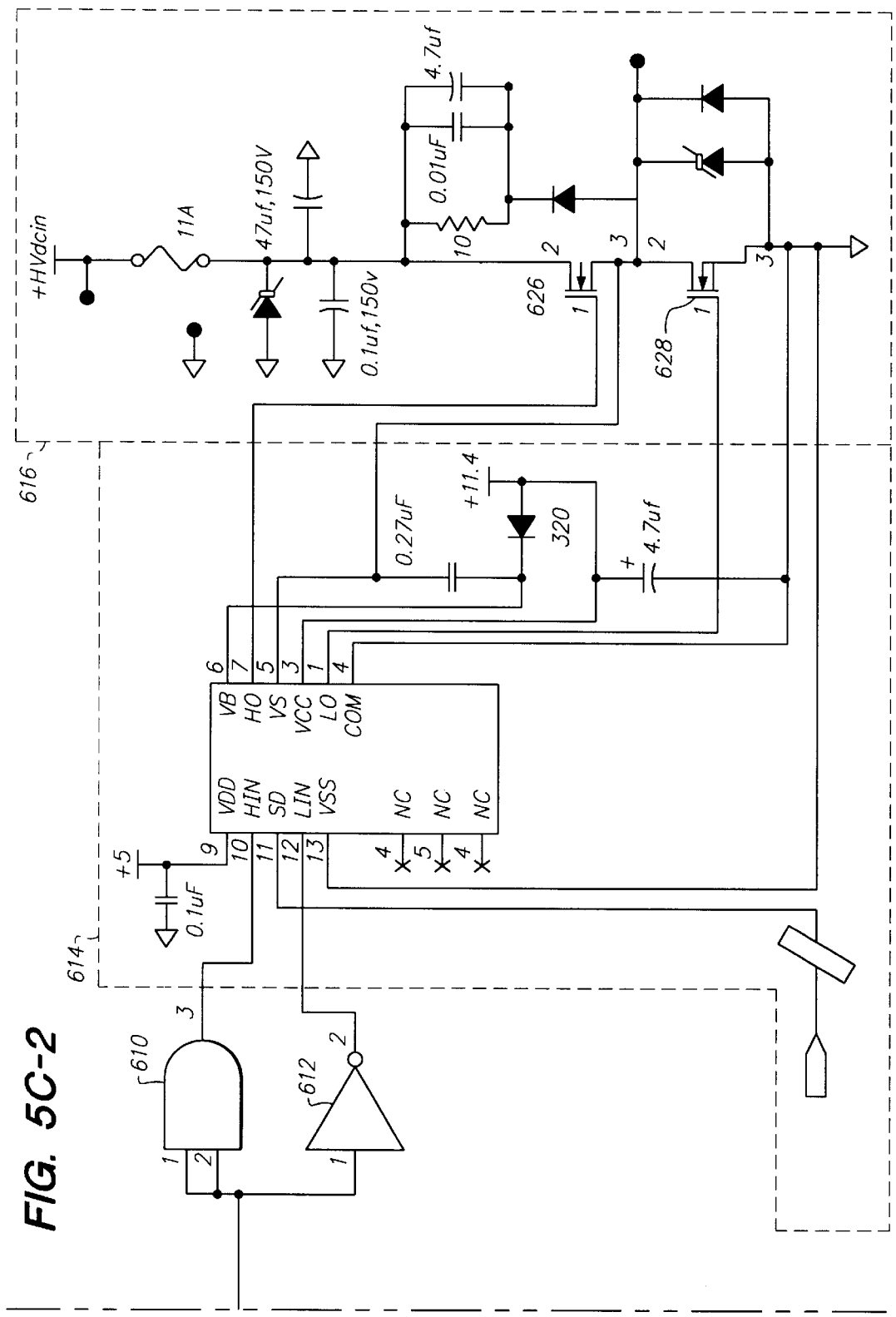
FIG. 5C is a schematic diagram of a pulse width modulator for use with the present invention.

FIG. 5C is a detailed schematic diagram of an embodiment of PWM 311 which is used to variably reduce the positive DC power source 305 voltage to linear amplifier 303. The PWM 311 includes a high performance buffer circuit 602, a gain control circuit 604, a high speed comparator circuit 606, a precision triangle wave generator circuit 608, an AND gate 610, an inverter 612, a driver circuit 614, a half bridge circuit 616 and low pass power filter circuits 549. The input to PWM 311 is a feedforward signal from the control system (not shown). PWM 311 is driven by DC power source 305.

High performance buffer circuit 602, which receives the feedforward signal, includes a differential amplifier which may be model INA105 from Burr-Brown. High performance buffer circuit 602 provides buffering and removes noise from the control system input signal.

The output from the high performance buffer circuit 602 is passed to the gain control circuit 604, which includes an operational amplifier which may be model OPA606 from Burr-Brown. The amplification of gain control circuit 604 is adjustable by varying the resistance of potentiometer 620. The output of gain control circuit 604 is passed to the "+IN" lead of high speed comparator circuit 606.

Precision triangle wave generator circuit 608 includes a precision waveform generator which may be model ICL8038 from Harris Semiconductor. The precision triangle wave generator circuit 608 sets the timing and controls the frequency of the PWM 311. The output of precision triangle wave generator circuit 608 is passed to the "−IN" lead of high speed comparator circuit 606.

The high speed comparator circuit 606 compares input voltage signals from gain control circuit 604 and precision triangle wave generator circuit 608. The output of comparator circuit 606 is logic one (e.g., five volts) if the output voltage of gain control circuit 604 is greater than the precision triangle wave generator circuit 608 output voltage. Conversely, if the precision triangle wave generator circuit 608 output is greater than the gain control circuit 604 output, the high speed comparator circuit 606 output is logic zero. The comparator circuit 606 includes a high speed comparator which may be model EL2018C from Elantec.

Because the output voltage of the precision triangle wave generator circuit 608 rapidly rises above and drops below the gain control circuit 604 output voltage, the output of the high speed comparator circuit 606 is a high frequency zero to five volt square wave. This method of producing the square wave by comparing an input voltage to a triangle wave is known in the art as "natural sampling". The high frequency square wave output of the comparator circuit 606 is forwarded to AND gate 610 and inverter 612. The AND gate 610 output is a logic zero to logic one square wave, while the inverter 612 output is a reversed logic zero to logic one square wave. The outputs of AND gate 610 and inverter 612 are passed to the driver circuit 614.

The driver circuit 614 produces pulsed outputs that are passed to the inputs of half bridge circuit 616. The duration and frequency of the pulses from the driver circuit 614 control the output voltage of PWM 311. The driver circuit 614 may include half bridge driver model HIP2500 from Harris Semiconductor.

The half bridge circuit 616 is driven by DC power source 305. The half bridge circuit 616 includes MOSFETs 626 and 628, which may be model number IRFI540G from International Rectifier. The drain of MOSFET 626 is connected to DC power source 305, the gate is connected to the driver circuit 614 "HO" output and the source is connected to the PWM 311 output. In this configuration, MOSFET 626 is toggled on and off at a high frequency by the output of driver circuit 614. The frequency and duration of the MOSFET 626 switching are controlled by the output of AND gate 610. The high voltage from DC power source 305 is converted into a high frequency square wave of variable pulse duration. The output of the half bridge circuit 616 is passed through low pass filter circuit 419 before being supplied to "+HV" lead of drive amplifier 507.

The drain of MOSFET 628 is connected to the output of PWM 311, the gate is connected to driver circuit 614 "LO" output, and the source is connected to ground. In this configuration, MOSFET 628 is toggled by the "LO" output of driver circuit 614. The frequency and duration of the MOSFET 628 switching are controlled by the output of inverter 612. Because the outputs of inverter 612 AND gate 610 are always reversed, MOSFET 628 will only be on when MOSFET 626 is off, and visa versa.

The low voltage filters 549 include filters 551, 553 and 555 which are a +15 volt DC filter, a −15 volt DC filter and a +5 volt DC filter respectively. The filters 551, 553 and 555 each include a symmetrical "Pi" filter and a ferrite core transformer. The symmetrical "Pi" filter removes high frequency components from the DC source voltages that drive the amplifier system components. By filtering the DC source voltages, noise is attenuated and will not be passed from or through PWM 311. Further, the "Pi" filter of the +15 volt DC filter 551 and the −15 volt DC filter 553 will attenuate any PWM noise before it reaches the common +15 volt and −15 volt DC power supplies. The ferrite core transformer filters unwanted electromagnetic interference frequency components from the common power supplies.

Figures 2, 5D:
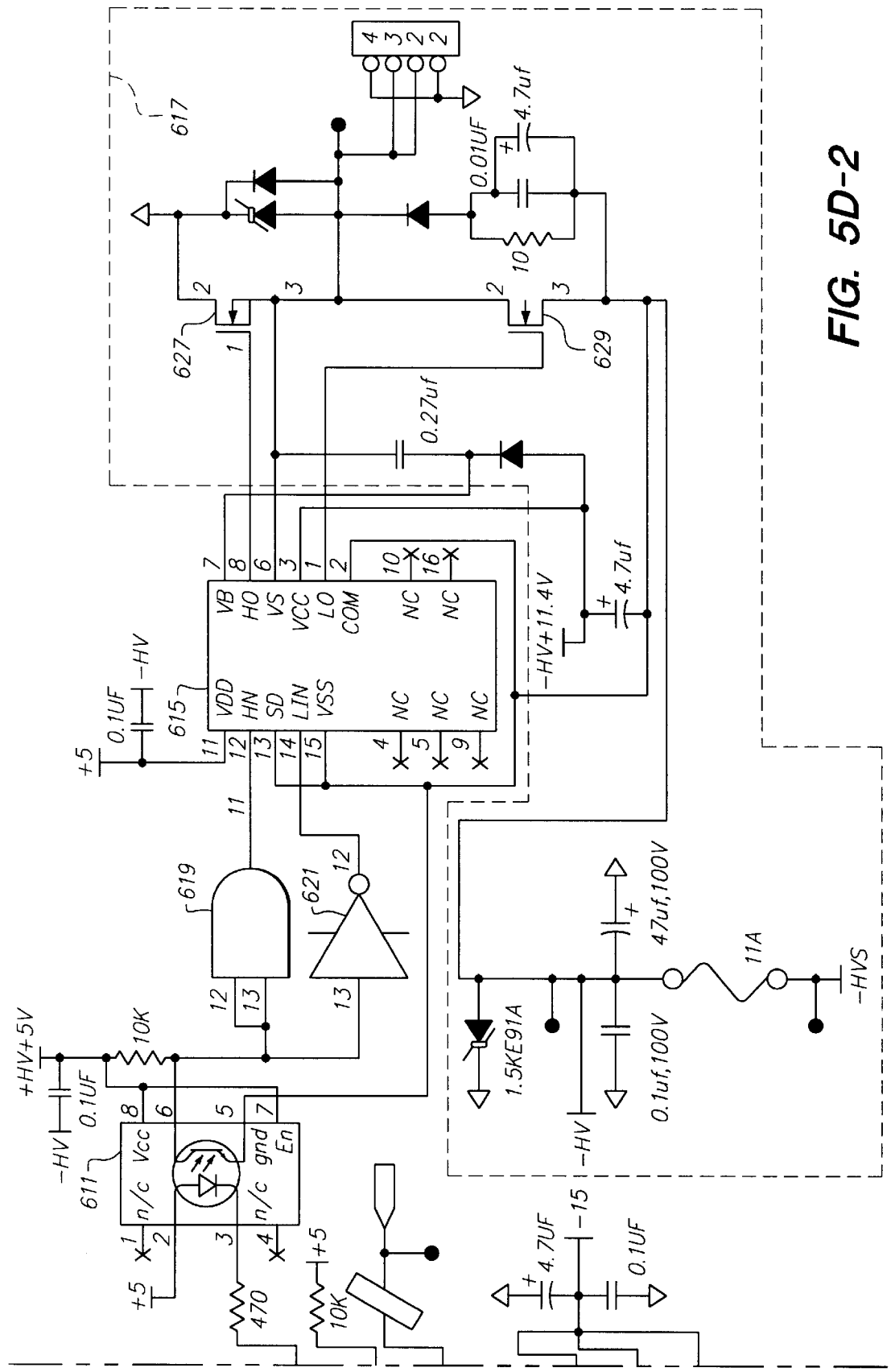
FIG. 5D is a schematic diagram of another pulse width modulator for use with the present invention.

FIG. 5D is a detailed schematic diagram of PWM 317 which is similar to the PWM 311 on FIG. 4C. The PWM 317 includes a high performance buffer circuit 603, a gain control circuit 605, a high speed comparator circuit 607, a precision triangle wave generator circuit 609, an opto-isolator 611, a driver circuit 615, a half bridge circuit 617, an AND gate 619, an inverter 621 and low pass filters 649. The PWM 317 is driven by DC power source 307. The high performance buffer circuit 603, gain control circuit 605, high speed comparator circuit 607, precision triangle wave generator circuit 609, AND gate 619 and inverter 621 are configured in the same manner as high performance buffer circuit 602, gain control circuit 604, high speed comparator circuit 606, precision triangle wave generator circuit 608, AND gate 610 and inverter 612 respectively (discussed above).

PWMs 311 and 317 differ in that the output of the high speed comparator 607 passes to opto-isolator 611, which provides a −HV to −HV+5 volt square wave. The opto-isolator electrically separates the driver circuit 615 and half-bridge circuit 617 from the rest of the PWM 209 circuit. The opto-isolator 611 is used with PWM 317 in order to separate the negative DC voltages used to drive half-bridge circuit 617 from the rest of the positive DC voltage PWM 317 circuit. An opto-isolator is not used with PWM 311 because all circuits operate at a positive DC voltage. The output of opto-isolator 611 is passed to AND gate 619 and inverter 621. The outputs of AND gate 619 and inverter 621 are forwarded to driver circuit 615 which may include model HIP2500 from Harris Semiconductor. Zero volt signals are converted into to −HV signals and five volts signals are converted into −HV+5 volt signals. Driver circuit 615 produces a square wave output that drives the half bridge circuit 617. The duration and frequency of the driver circuit 615 pulses control the effective output voltage and frequency of PWM 317.

The half bridge circuit 617 includes a MOSFET 627 and a MOSFET 629, which may be model number IRFI540G from International Rectifier. The source of the MOSFET 627 is connected to the PWM 317 output, the gate is connected to the output of driver circuit 615 and the drain is connected to ground. MOSFET 627 and driver circuit 615 interact the same way that MOSFET 626 and driver circuit 614 do on FIG. 5C. The output of the half bridge circuit 617 is passed through low pass filter circuit 421 before being supplied to "−HV" lead of drive amplifier 507.

The drain of MOSFET 629 is connected to the output of PWM 317, the gate is connected to driver circuit 615 "LO" output, and the source is connected to DC power source 307. In this configuration, MOSFET 629 is toggled by the "LO" output of driver circuit 615. The frequency and duration of the MOSFET 629 switching are controlled by the output of inverter 621. MOSFET 629 and driver circuit 615 interact the same way that MOSFET 628 and driver circuit 614 do on FIG. 5C. Similarly, low pass filters 649 function the same way that low pass filters 549 do on FIG. 5C.

Figure 5E:
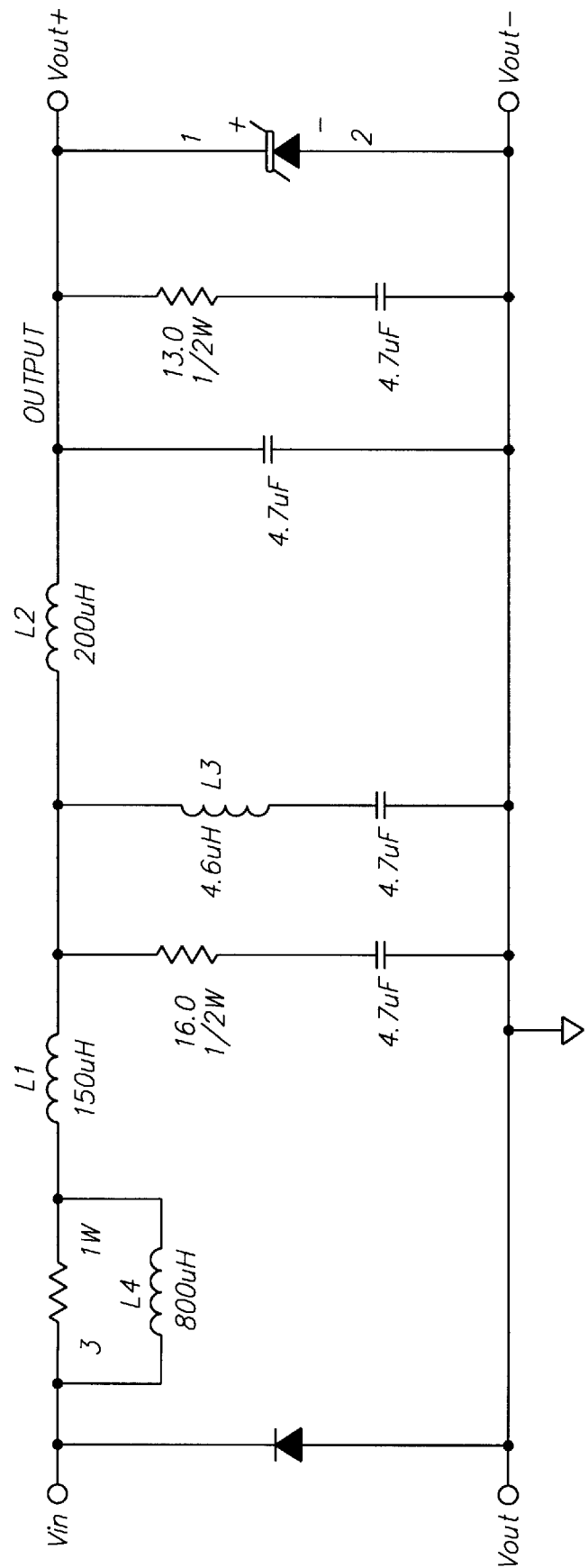
FIG. 5E is a schematic diagram of low pass filter circuits for use with the present invention.

FIG. 5E is a detailed schematic diagram of low pass filter circuits 419 and 421. Low pass filter circuit 419 removes the high frequency components from the PWM 311 output; low pass filter circuit 421 removes the high frequency components from the PWM 317 output. The exemplary filter circuits do not have a resonant frequency and provide a smooth cut off frequency between 6 and 8 kHz.

In another embodiment, the present invention may be used as a three phase power amplifier or any other multiphase power amplifier. One power amplifier such as the power amplifier described above may be used on each leg of a three phase power supply. As described above with respect to a single phase application, this invention will similarly improve the operating efficiency of three phase linear amplifiers under variable load output conditions.

Amplifier systems in accordance with the present invention have an operating energy efficiency which is considerably higher than prior art amplification systems. While the invention has been described in terms of a preferred embodiment above, those skilled in the art will readily appreciate that numerous modifications, substitutions and additions may be made to the disclosed embodiments without departing from the spirit and scope of the present invention. It should also be noted that there are many alternative ways of implementing the techniques of the present invention. It is intended that all such modifications, substitutions and additions fall within the scope of the present invention which is best defined by the claims below.

I claim:

1. An amplifier system comprising:
   a drive amplifier having an input terminal and an output terminal, said output terminal providing a drive amplifier output signal proportional to a drive amplifier input signal on said input terminal;
   a differential voltage control unit for monitoring at least one of said drive amplifier input and output signals; and
   a positive and a negative pulse width modulated power supply, each power supply supplying output power to said drive amplifier and being operatively connected to said differential voltage control unit, wherein said differential voltage control unit controls said output power of each of said power supplies to a predetermined differential value in accordance with at least one of said drive amplifier input and output signals.

2. The amplifier system of claim 1, wherein said drive amplifier comprises a linear amplifier.

3. The amplifier system of claim 1, wherein said drive amplifier comprises a monolithic operational amplifier.

4. The amplifier system of claim 1, wherein said differential voltage controller uses said drive amplifier input signal as a feedforward signal to control each of said positive and negative pulse width modulated power supplies.

5. The amplifier system of claim 1, wherein said differential voltage controller uses said drive amplifier output signal as a feedback signal to control each of said positive and negative pulse width modulated power supplies.

6. The amplifier system of claim 1, wherein said positive pulse width modulated power supply includes a first pulse width modulator driven by a positive power source, and said negative pulse width modulated power supply includes a second pulse width modulator driven by a negative power source.

7. The amplifier system of claim 6, wherein said positive and negative pulse width modulated power supplies each include a filter respectively coupled between said first and second pulse width modulators and said drive amplifier.

8. The amplifier system of claim 7, wherein said filters are low pass filters having a cut off frequency between approximately 5–10 kHz.

9. An amplifier system comprising:
- a drive amplifier having an input terminal and an output terminal, said output terminal providing a drive amplifier output signal proportional to a drive amplifier input signal on said input terminal, wherein said drive amplifier includes:
  - a linear amplifier;
  - a first difference amplifier having a first differential input terminal and a difference amplifier output terminal, said difference amplifier output terminal being connected to an input terminal of said linear amplifier; and
  - a current sensor connected to an output terminal of said linear amplifier and to said first differential input terminal, said current sensor providing said difference amplifier with an indication of an output current from said output terminal of said drive amplifier;
- a differential voltage control unit for monitoring at least one of said drive amplifier input and output signals; and
- a positive and a negative pulse width modulated power supply, each power supply supplying output power to said drive amplifier and being operatively connected to said differential voltage control unit, wherein said differential voltage control unit controls said output power of each of said power supplies to a predetermined differential value in accordance with at least one of said drive amplifier input and output signals.

10. The amplifier system of claim 9, wherein said current sensor includes a resistor connected to said output terminal of said linear amplifier and a second difference amplifier, said second difference amplifier monitoring a voltage across said resistor and sending a signal proportional to said voltage to a second differential input terminal of said first difference amplifier.

11. The amplifier system of claim 10, wherein said resistor has a value less than approximately 0.1 ohms.

12. A method of providing a current proportional to an input voltage, the method comprising the steps of:
- amplifying an input signal using a drive amplifier to produce an output signal proportional to said input signal;
- monitoring at least one of said drive amplifier input and output signals;
- supplying power to said drive amplifier with a positive and a negative pulse width modulated power supply; and
- controlling said supply of power to said drive amplifier to a predetermined differential value in accordance with at least one of said drive amplifier input and output signals.

13. The method of claim 12, wherein the step of supplying power includes the step of filtering said supply of power with at least one low pass filter.

14. The method of claim 13, wherein a cutoff frequency of said low pass filter is between approximately 5 and 10 kHz.

15. The method of claim 12, further including a step of using a feedback signal to monitor at least one of said drive amplifier input and output signal.

16. An amplifier system comprising:
- amplifier means for providing an output signal on an output terminal proportional to an input signal on an input terminal;
- monitoring means coupled to one of said input terminal and said output terminal, said monitoring means for monitoring at least one of said input and output signals; and
- a positive and a negative pulse width modulated power supply, each power supply provides power to said amplifier means and said monitoring means controls said output power of each of said power supplies to a predetermined differential value in accordance with at least one of said input and output signals.

17. The amplifier system of claim 16, wherein said amplifier means comprises a linear amplifier.

18. An amplifier system comprising:
- amplifier means for providing an output signal on an output terminal proportional to an input signal on an input terminal, wherein said amplifier means comprises an integrating amplifier;
- monitoring means for monitoring at least one of said input and output signals; and
- a positive and a negative pulse width modulated power supply, each power supply provides power to said amplifier means and said monitoring means controls said output power of each of said power supplies to a predetermined differential value in accordance with at least one of said input and output signals.

19. The amplifier system of claim 16, wherein said monitoring means uses said input signal as a feedforward signal to control each of said positive and negative pulse width modulated power supplies.

20. The amplifier system of claim 16, wherein said monitoring means uses said output signal as a feedback signal to control each of said positive and negative pulse width modulated power supplies.

21. The amplifier system of claim 16, wherein said positive pulse width modulated power supply includes a first pulse width modulator driven by a positive power source, and said negative pulse width modulated power supply includes a second pulse width modulator driven by a negative power source.

22. The amplifier system of claim 21, wherein said positive and negative pulse width modulated power supplies each include a filter respectively coupled between said first and second pulse width modulators and said amplifier means.

23. The amplifier system of claim 22, wherein said filters are low pass filters having a cut off frequency between approximately 5–10 kHz.

* * * * *